(12) United States Patent
Chen et al.

(10) Patent No.: US 11,693,045 B2
(45) Date of Patent: Jul. 4, 2023

(54) TESTING MODULE AND TESTING METHOD USING THE SAME

(71) Applicant: Taiwan Semiconductor Manufacturing Company, Ltd., Hsinchu (TW)

(72) Inventors: Hao Chen, New Taipei (TW); Mill-Jer Wang, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 17/884,487

(22) Filed: Aug. 9, 2022

(65) Prior Publication Data

US 2022/0381817 A1 Dec. 1, 2022

Related U.S. Application Data

(63) Continuation of application No. 16/805,874, filed on Mar. 2, 2020.

(60) Provisional application No. 62/893,792, filed on Aug. 29, 2019.

(51) Int. Cl.
*G01R 31/27* (2006.01)
*G01R 1/04* (2006.01)

(52) U.S. Cl.
CPC ......... *G01R 31/275* (2013.01); *G01R 1/0466* (2013.01); *G01R 1/0491* (2013.01)

(58) Field of Classification Search
CPC .............. G01R 19/257; G01R 31/2884; G01R 31/3004; G01R 31/3181; G01R 31/31813
See application file for complete search history.

(56) References Cited

U.S. PATENT DOCUMENTS

| | | | |
|---|---|---|---|
| 7,138,811 B1 * | 11/2006 | Mahoney | G01R 31/2889 324/762.02 |
| 7,288,949 B2 * | 10/2007 | Kim | G01R 31/2889 324/762.01 |

* cited by examiner

*Primary Examiner* — Tung X Nguyen
(74) *Attorney, Agent, or Firm* — JCIPRNET

(57) ABSTRACT

A testing module for a semiconductor wafer-form package includes a circuit board structure, first connectors, a first connecting structure, second connectors, third connectors and a first bridge connector. The circuit board structure includes two edge regions and a main region located therebetween. The first connectors are located over the edge regions and connected to the circuit board structure. The first connecting structure is located over and distant from the circuit board structure. The second connectors and third connectors are located over and connected to the first connecting structure, where the third connectors are configured to transmit electric signals for testing the semiconductor wafer-form package being placed over the main region. The first bridge connector is electrically coupling the circuit board structure and the first connecting structure by connecting the second connectors and the first connectors.

20 Claims, 21 Drawing Sheets

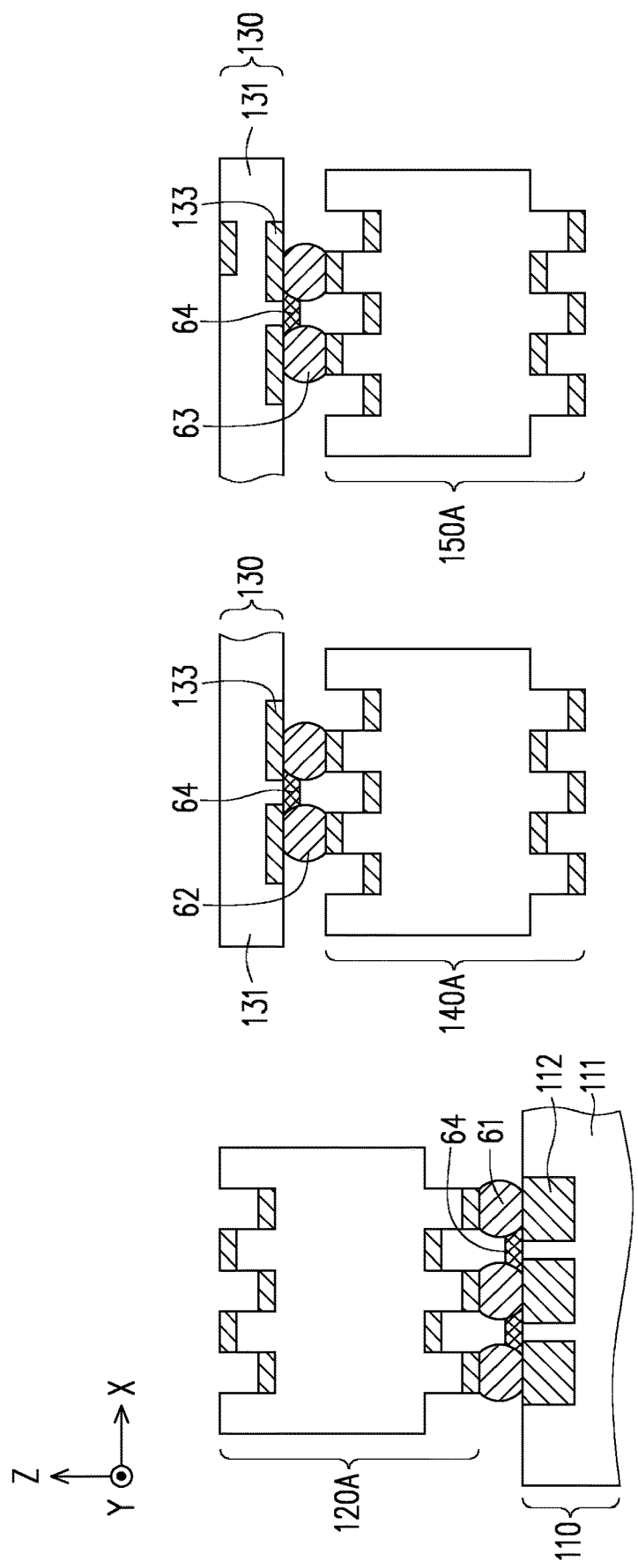

TESTING MODULE AND TESTING METHOD USING THE SAME

CROSS-REFERENCE TO RELATED APPLICATION

This application is a continuation application of and claims the priority benefit of a prior application Ser. No. 16/805,874, filed on Mar. 2, 2020. The prior application Ser. No. 16/805,874 claims the priority benefit of U.S. provisional application Ser. No. 62/893,792, filed on Aug. 29, 2019. The entirety of each of the above-mentioned patent applications is hereby incorporated by reference herein and made a part of this specification.

BACKGROUND

Modern day integrated chips comprise millions or billions of semiconductor devices formed on a semiconductor substrate (e.g., silicon substrate). The semiconductor devices on the semiconductor substrate are tested for functional defects and/or performance characteristics. For example, a wafer acceptance test (WAT) is an electrical test in which a wafer prober sends electrical test signals to the semiconductor devices. The electrical test signals check the functionality of the semiconductor devices and identify devices that fail to meet design specifications.

BRIEF SUMMARY OF THE INVENTION

In accordance with some embodiments, a testing module for a semiconductor wafer-form package includes a circuit board structure, first connectors, a first connecting structure, second connectors and third connectors, and a first bridge connector. The circuit board structure includes two edge regions and a main region disposed therebetween. The first connectors are disposed over the edge regions and mechanically connected to the circuit board structure. The first connecting structure is disposed over and distant from the circuit board structure. The second connectors and the third connectors are disposed over and mechanically connected to the first connecting structure, where the third connectors are configured to transmit electric signals for testing the semiconductor wafer-form package being placed over the main region. The first bridge connector is electrically coupling the circuit board structure and the first connecting structure by contacting the second connectors and the first connectors. The semiconductor wafer-form package is surrounded by the circuit board structure, the first connectors, the first connecting structure, the second connectors, the third connectors, and the first bridge connector.

In accordance with some embodiments, a testing module for a semiconductor wafer-form package includes a circuit board structure, first connectors, an elastic element, an elastic element, a first connecting structure, second connectors and third connectors, and a first bridge connector. The circuit board structure includes two edge regions and a main region located therebetween. The first connectors are disposed on the edge regions and connected to the circuit board structure. The elastic element is disposed on the main region, where the elastic element is sandwiched between the semiconductor wafer-form package and the circuit board structure. The first connecting structure is disposed over and distant from the circuit board structure. The second connectors and the third connectors are disposed over and connected to the first connecting structure, where the third connectors are configured to transmit electric signals for testing the semiconductor wafer-form package being placed over the main region. The first bridge connector is electrically coupling the circuit board structure and the first connecting structure by connecting the second connectors and the first connectors.

In accordance with some embodiments, a testing module for a semiconductor wafer-form package includes a circuit board structure, first connectors, a first connecting structure and a second connecting structure, second connectors and third connectors, a first bridge connector, and a second bridge connector. The circuit board structure includes two edge regions and a main region located therebetween. The first connectors are disposed on the edge regions and connected to the circuit board structure. The first connecting structure and the second connecting structure are disposed over and distant from the circuit board structure. The second connectors and the third connectors are disposed over and connected to the first connecting structure and the second connecting structure, where the third connectors are configured to transmit electric signals for testing the semiconductor wafer-form package being placed over the main region. The first bridge connector is electrically coupling the circuit board structure to the first connecting structure and the second connecting structure by connecting the second connectors and the first connectors. The second bridge connector is disposed over the main region and electrically coupled to the first connecting structure and the second connecting structure through the semiconductor wafer-form package, where the second bridge connector is configured to removably install on the semiconductor wafer-form package. The semiconductor wafer-form package is surrounded by the circuit board structure, the first connectors, the first bridge connector, the second connectors, the first connecting structure, the second connecting structure, the third connectors, and the second bridge connector.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A, FIG. 3B and FIG. 3C are partially enlarged, schematic cross-sectional views of a connector in accordance with some embodiments of the disclosure.

DETAILED DESCRIPTION

Figure 1:
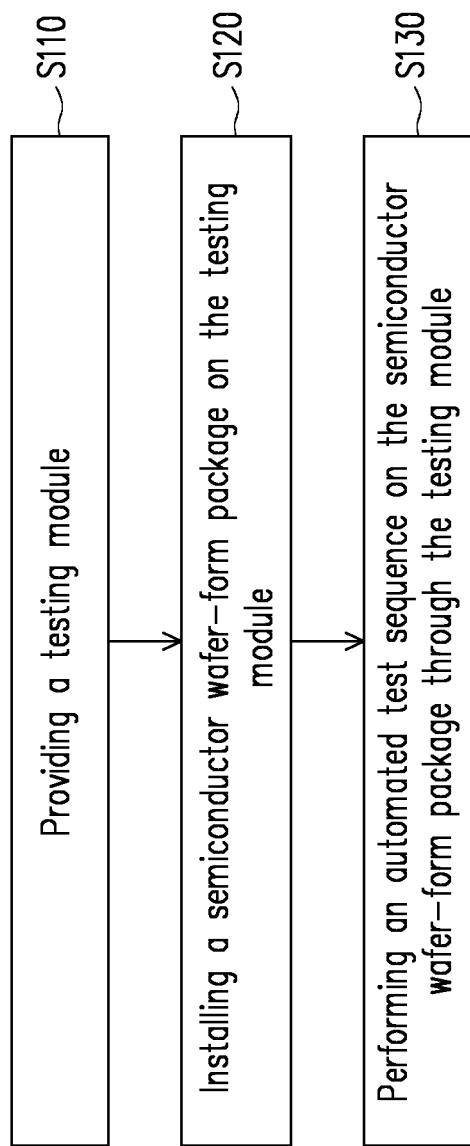
FIG. 1 illustrates a flowchart of a method for using a testing module in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed. In the disclosure, it should be appreciated that the illustration of components throughout all figures is schematic and is not in scale.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth", "fifth" and the like, may be used herein for ease of description to describe similar or different element(s) or feature(s) as illustrated in the figures, and may be used interchangeably depending on the order of the presence or the contexts of the description.

In some embodiments, for a fan-out wafer level chip scale package (WLCSP), semiconductor dies are sawed from wafers before they are packaged onto other wafers, and only "known-good-dies" are packaged. An advantageous feature of this packaging technology is that the I/O pads on a semiconductor die can be redistributed to a greater area than the semiconductor die itself, and hence the number of I/O pads packed on the surfaces of the semiconductor dies can be increased. The disclosure will be described with respect to embodiments in a specific context, namely a testing module and a testing system having the same which that realize efficient testing method for the fan-out WLCSP. The embodiments are not limited in this context. And, the embodiments are intended to provide further explanations but are not used to limit the scope of the disclosure.

Figure 2A:
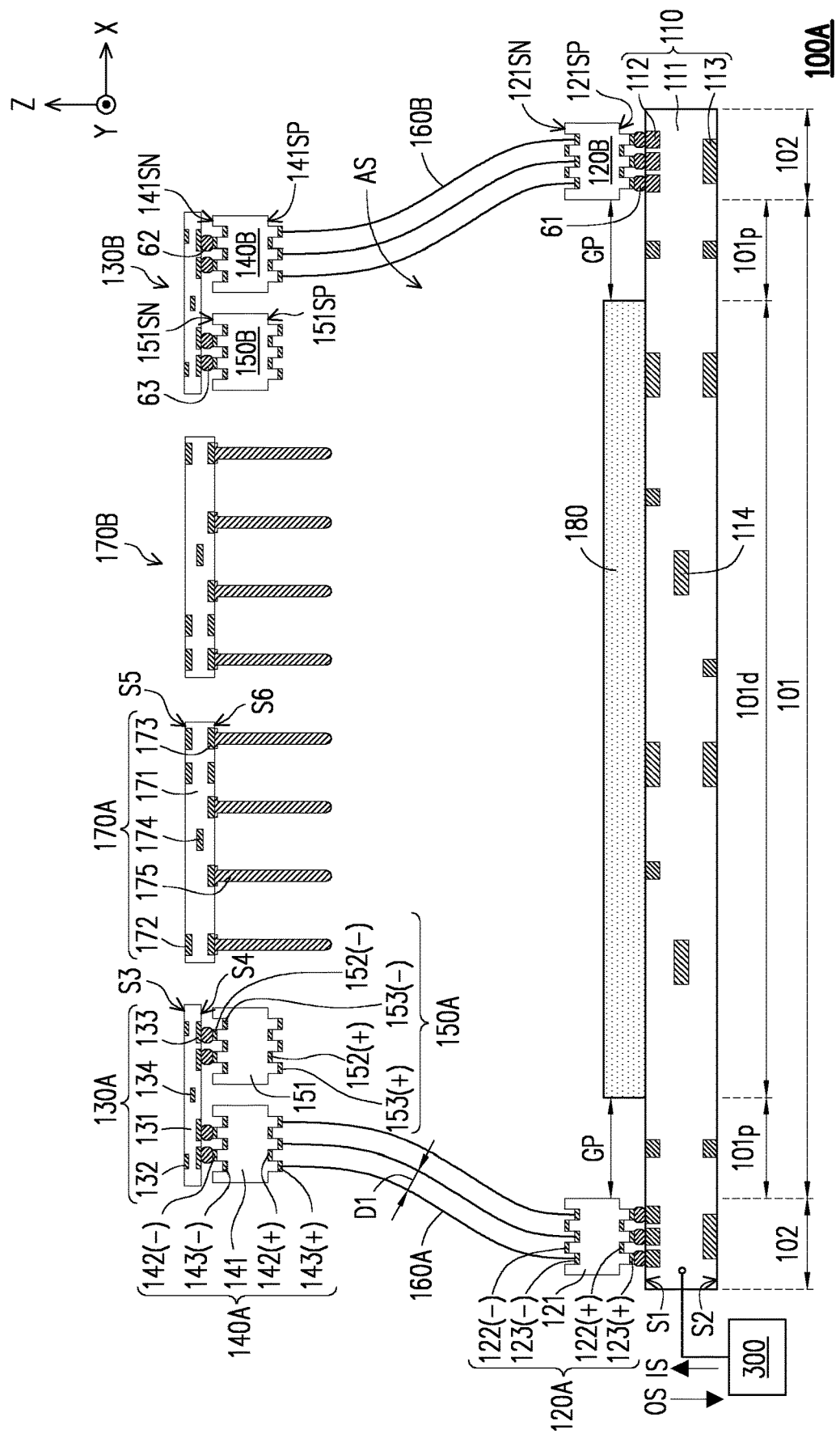
FIG. 2A is a schematic cross-sectional view of a testing module in accordance with some embodiments of the disclosure.
Figure 4:
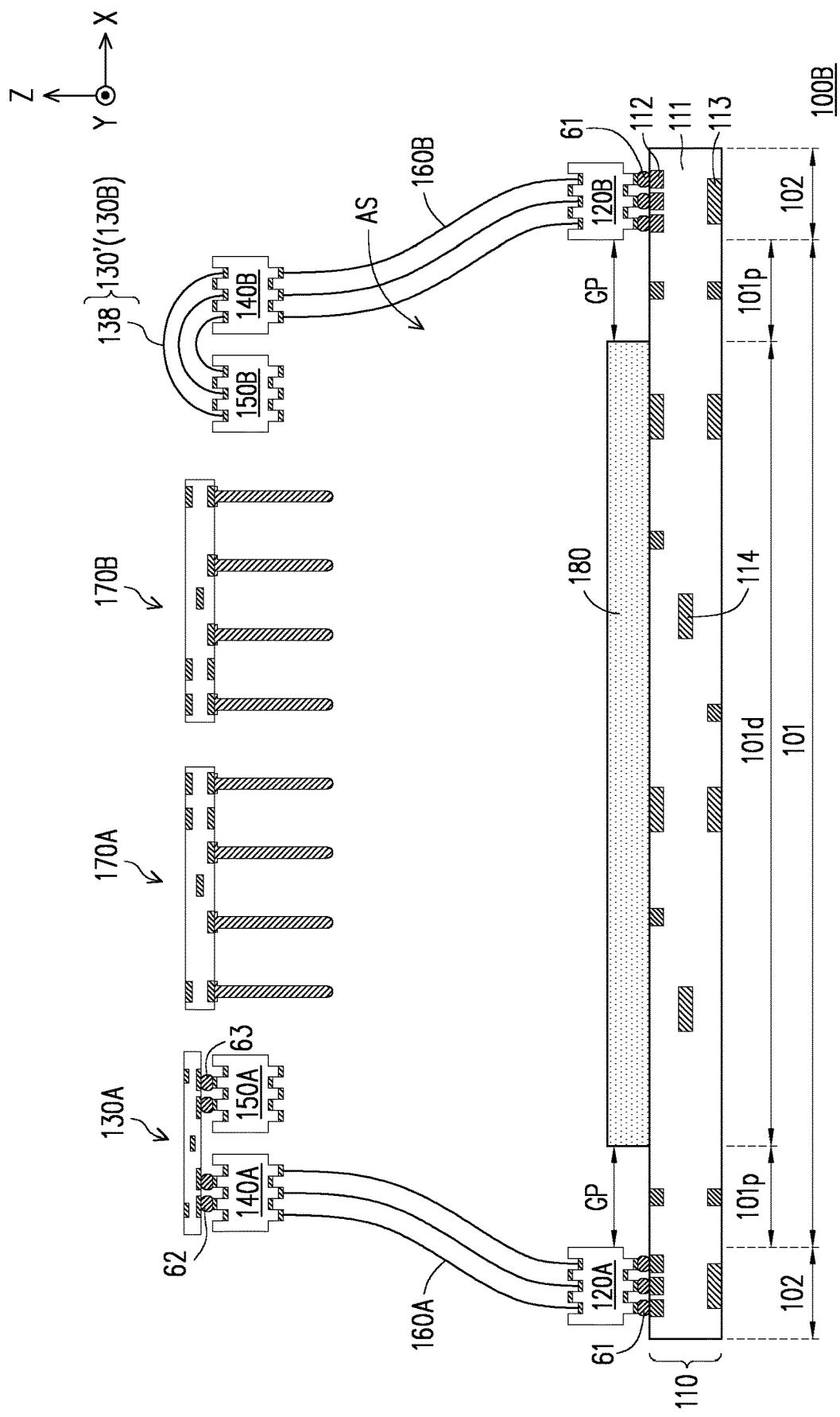
FIG. 4 is a schematic cross-sectional view of a testing module in accordance with some embodiments of the disclosure.
Figure 5:
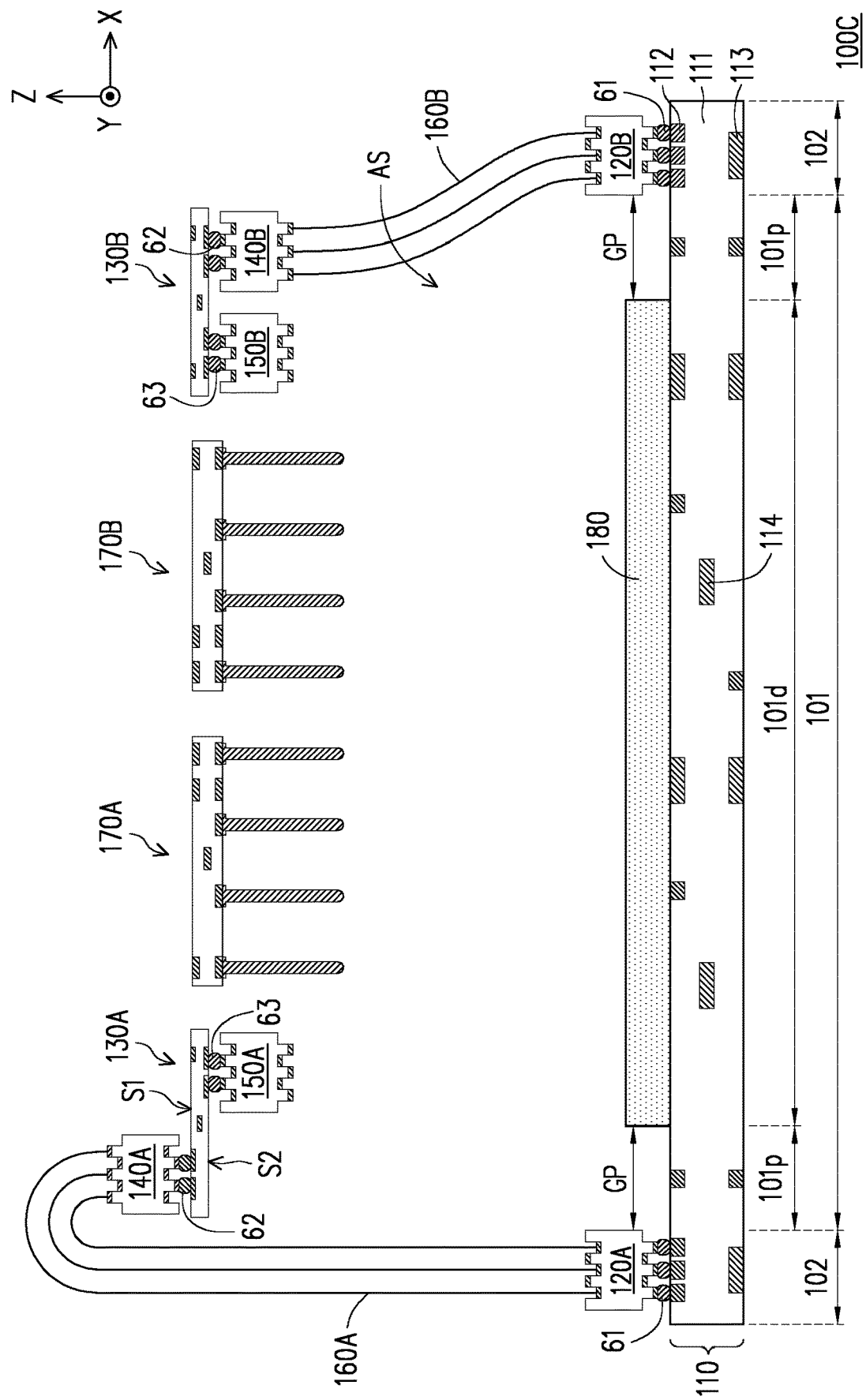
FIG. 5 is a schematic cross-sectional view of a testing module in accordance with some embodiments of the disclosure.

FIG. 1 illustrates a flowchart of a method for using a testing module in accordance with some embodiments of the disclosure. FIG. 2A, FIG. 4 and FIG. 5 are independently schematic cross-sectional views of a testing module in accordance with some embodiments of the disclosure, where FIG. 2A is a cross-sectional view taken along a line AA' depicted in FIG. 2B. FIG. 3A through FIG. 3C illustrate partially enlarged and schematic cross-sectional views of a connector in accordance with some embodiments of the disclosure. The elements similar to or substantially the same as the elements described previously will use the same reference numbers, and certain details or descriptions (e.g. the materials, positioning configurations, electrical connection relationships, etc.) of the same elements would not be repeated herein.

Figure 2B:
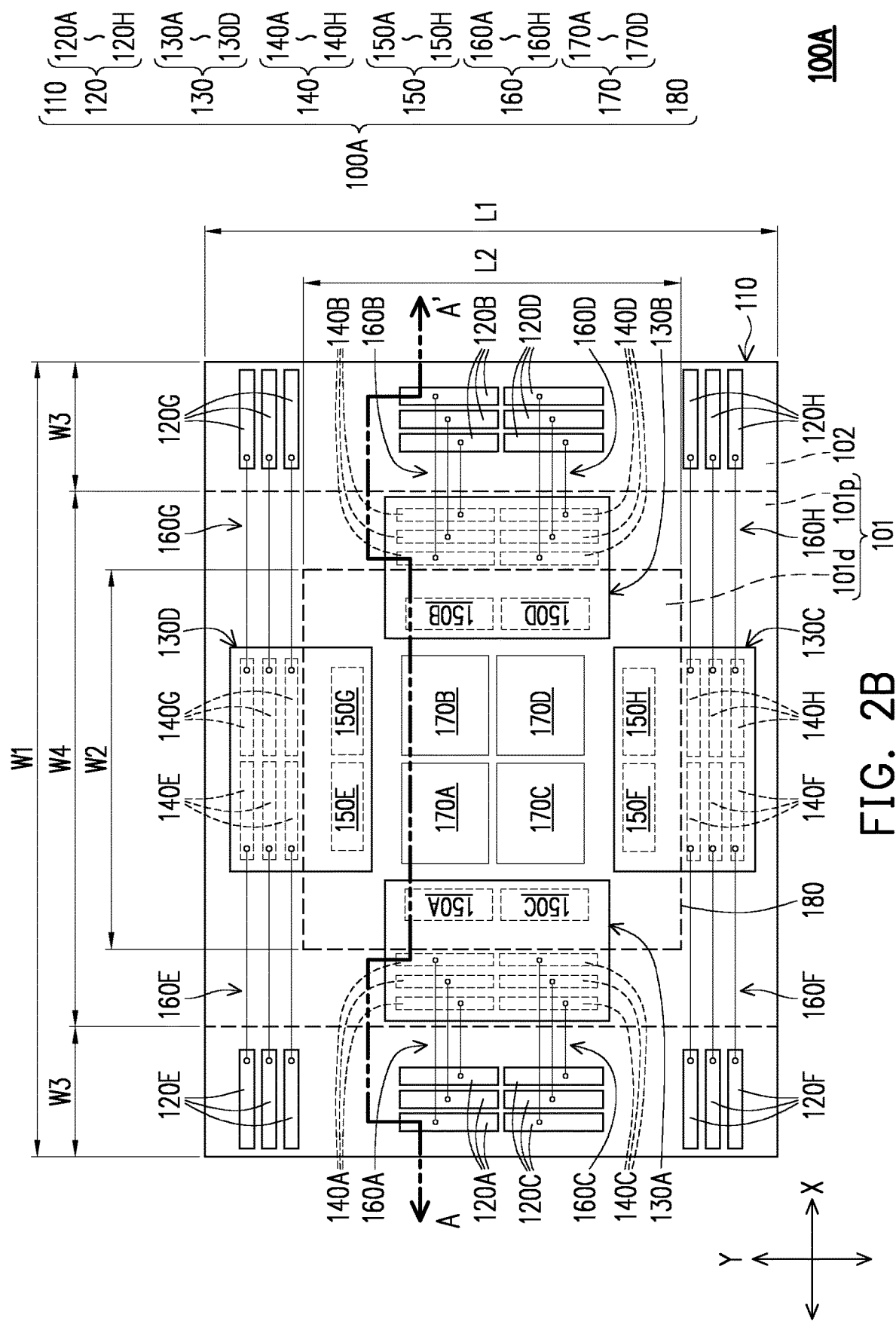
FIG. 2B is a top view illustrating the testing module depicted in FIG. 2A.

In some embodiments, a testing module is provided, in accordance with step S110 of FIG. 1. For example, as shown in FIG. 2A and FIG. 2B, an testing module 100A including a circuit board structure 110, a plurality of connectors 120 (e.g., 120A through 120H), at least one connecting structure 130 (e.g., 130A through 130D), a plurality of connectors 140 (e.g., 140A through 140H), a plurality of connectors 150 (e.g., 150A through 150H), at least one connecting structure 160 (e.g., 160A through 160H), at least one circuit board structure 170 (e.g., 170A through 170D) and an elastic element 180 is provided. The circuit board structure 110 may include a main region 101 and at least one edge region 102. In some embodiments, the circuit board structure 110 has one main region 101 and two edge regions 102, and the main region 101 is sandwiched between the edge regions 102 along a direction X, where the main region 101 has a device region 101d and a periphery region 101p surrounding the device region 101a. For example, the periphery region 101p is in the form of a closed frame shape which surrounds around a perimeter of the device region 101d, as shown in the top view of FIG. 2B. In other words, the device region 101a may be separated from the edge regions 102 through the periphery region 101b along the direction X. In alternative embodiments, the main region 101 has the device region 101a without the periphery region 101b, where the device region 101a is directly located between the edge regions 102 along the direction X. The device region 101a may be, e.g. at two opposite sides thereof along direction X, connected to the edge regions 102.

For example, as shown in the top view of FIG. 2B, the shape of the main region 101 and the shapes of the edge regions 102 are rectangular shapes, and the shape of the device region 101d is a circular shape while the shape of the periphery regions 101p is a shape having an outermost perimeter of a rectangular shape and a innermost perimeter of a closed ring-shape, however the disclosure is not limited thereto. The shapes of the main region 101, the device region 101d and the edge regions 102 may be circular, oral, ellipse, square, or any suitable polygonal shapes. In some embodiments, a length L1 of the circuit board structure 110 is measured along a direction Y, and a width W1 of the circuit board structure 110 is measured along the direction X, where the length L1 is also referred to as a length of the main region 101 and lengths of the edge regions 102. For example, the width W1 is 40 cm while the length L1 is 57 cm. In some embodiments, a length L2 of the device region 101d is measured along the direction Y, and a width W2 of the device region 101d is measured along the direction X. In some embodiments, a width W3 of the edge regions 102 is measured along the direction X, and a width W4 of the main region 101 measured along the direction X, where the width W1 is a sum of the width W4 plus two times of the width W3, and the width W2 is less than or substantially equal to the width W4. In some embodiments, the length L2 is s less than or substantially equal to the length L1. The shape of the periphery region 101p (if any) may be a closed-frame shape configured to engage the shape of the device region 101d.

In some embodiments, the circuit board structure 110 includes a substrate 111, a plurality of contact pads 112, a plurality of contact pads 113, and an internal circuitry 114 including metallization layers and vias (not shown) interconnected. In some embodiments, the substrate 111 includes a substrate made of a dielectric material; for example, a polymer such as polyimide (PI), polybenzoxazole (PBO), benzocyclobutene (BCB), a nitride such as silicon nitride, an oxide such as silicon oxide, a silicon oxynitride, phosphosilicate glass (PSG), borosilicate glass (BSG), boron-doped phosphosilicate glass (BPSG), a combination thereof or the like. In some embodiments, the contact pads 112 and the contact pads 113 are respectively distributed on two opposite sides of the substrate 111, and are exposed for electrically connecting with later-formed elements/features. The contact pads 112 may be distributed over the surface S1 of the substrate 111, while the contact pads 113 may be distributed over the surface S2 of the substrate 111; or, vice versa. The surface S1 and surface S2 are opposite to each other along a direction Z, for example, as shown in FIG. 2A. In some embodiments, the internal circuitry 114 (including the metallization layers and the vias) is embedded in the substrate 111 and provides a routing function for the substrate 111, where the metallization layers and the vias included in the internal circuitry 114 are electrically connected to the contact pads 112 and the contact pads 113. That is, the contact pads 112 are electrically coupled to the contact pads 113 through the internal circuitry 114 (including the metallization layers and the vias), for example. On the other hand, in some embodiments, one of the contact pads 112 is also electrically coupled to another contact pad 112 through the internal circuitry 114, and/or one of the contact pads 113 is also electrically coupled to another contact pad 113 through the internal circuitry 114. Note that, the direction X is not the same as the direction Y, and the direction X and the direction Y are independently perpendicular to the direction Z, for example.

The materials of the contact pads 112 may be the same as the materials of the contact pads 113. In some embodiments, the contact pads 112 and the contact pads 113 include aluminum pads. The materials of the metallization layers and the vias included in the internal circuitry 114 may include conductive materials formed by electroplating or deposition, such as aluminum, titanium, copper, nickel, tungsten, and/or alloys thereof, which may be patterned using a photolithography and etching processes. In some embodiments, the metallization layers included in the internal circuitry 114 are patterned copper layers, and the vias included in the internal circuitry 114 are copper vias. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc. The materials of the metallization layers and the vias may be the same, the disclosure is not limited thereto. Alternatively, the material of the metallization layers may be different from the material of vias.

In certain embodiments, the circuit board structure 110 includes an organic flexible substrate or a printed circuit board that having a circuit structure therein and connecting to a controller (e.g., 300 depicted in FIG. 2A) with or without built-in memory devices (e.g., for storing testing settings or test results). The controller 300 may include analog and digital circuits, a processor, or a combination thereof. The controller 300 may be implemented by circuitry including, but not limited to, analog circuit, digital circuit, semiconductor integrated circuit such as at least one processor (e.g., a central processing unit (CPU)), at least one application specific integrated circuit (ASIC), and/or at least one field programmable gate array (FPGA), or a combination thereof. The at least one processor may be configured or programmed, by reading one or more instructions from at least one machine readable tangible medium, to perform the functions of the controller 300 as described further below. The controller 300 may be an automatic (or automated) testing equipment (ATE) to perform measurements (by generating and sending testing electric signals and receiving responsive electric signals) and evaluate the test results (e.g., analysis of the responsive electric signals) for testing the integrated circuits and internal circuitries of the semiconductor wafer-form package (e.g., an object to-be-tested or a device under test (DUT)). In certain embodiments, the controller 300 is an external component being electrically coupled to the testing module 100A, as shown in FIG. 2A. In some alternative embodiments, the controller 300 is a built-in component of the testing module 100A.

It is appreciated that, the object to-be-tested has electrical characteristics (e.g., voltage or current characteristics) that are desired to be measured and/or tested at various positions, where the testing module 100A is provided to connect with the controller 300 to facilitate efficient identification of failures in interconnects inside the object to-be-tested. For example, the circuit board structure 110 serves as a loadboard for an ATE, where a variety of electrical components/devices (such as integrated circuits, resistors, capacitors, inductors, relays, etc.) are employed to make up the loadboard's test circuit. However, the disclosure is not limited thereto, in alternative embodiments, the circuit board structure 110 serves as a loadboard for an ATE, which is free of additional electrical components/devices. The disclosure is not limited thereto. The circuit board structure 110 sometimes may be referred to as a main testing board.

In alternative embodiments, the substrate 111 includes a core layer (not shown) with a plurality of plated through holes penetrating therethrough, where dielectric structures are respectively located on two opposite sides thereof, and each of the dielectric structure includes one internal circuitry 114 (including the metallization layers and vias) embedded therein. For example, the internal circuitries 114 formed in the dielectric structures are electrically coupled to each other through the plated through holes penetrating the core layer, and the contact pads 112 and the contact 113 are respectively formed atop a respective one of the internal circuitries 114 and are electrically coupled to each other through the internal circuitries 114 and the plated through holes therebetween. In other words, the plated through holes may provide electrical paths between the electrical circuits located on two opposing sides of the core layer. With such, the contact pads 112, the contact pads 113, the internal circuitries 114 and the plated through holes penetrating the core layer together provides a routing function for the substrate 111. In certain embodiments, one internal circuitry 114 and the respective one dielectric structure are together referred to as a build-up layer located over the core layer.

In some embodiments, the core layer includes a core dielectric layer, such as prepreg (which contains epoxy, resin, silica filler and/or glass fiber), Ajinomoto Buildup Film (ABF), resin coated copper foil (RCC), polyimide, photo image dielectric (PID), ceramic core, glass core, molding compound, a combination thereof, or the like. However, the disclosure is not limited thereto, and other dielectric materials may also be used. The core dielectric layer may be formed by a lamination process, a coating process, or the like. In some embodiments, the plated through holes may be lined with a conductive material and filled up with an insulating material. In some embodiments, the method of forming the plated through holes includes the following operations. First, through holes are formed at the predetermined positions in the core layer by, for example, a mechanical or laser drilling, an etching, or another suitable removal technique. A desmear treatment may be performed to remove residues remaining in the through holes formed in the core layer. Subsequently, the through holes formed in the core layer may be plated with one or more conductive materials to a predetermined thickness, thereby providing the plated through holes penetrating the core layer. For example, the through holes formed in the core layer may be plated with copper with an electroplating or an electroless plating.

In some embodiments, the build-up layers (each including one internal circuitry 114 and the respective one dielectric structure) are respectively located on the opposite sides of the core layer. The formation of each of the build-up layers may include sequentially forming a plurality of dielectric layers and a plurality of conductive patterns, where the dielectric layers and the conductive patterns are alternately stacked over the one surface of the core layer. For example, a material of the dielectric layers is ABF, prepreg, RCC, polyimide, PID, molding compound, a combination thereof, or the like. The core layer and the dielectric layers may be made of the same material. For example, the material of the core dielectric layer and the dielectric layers may be molding compound such as epoxy molding compound (EMC). The dielectric layers may be formed by a lamination process, a coating process, or the like. The number of layers of conductive patterns and the number of layers of dielectric layers is not limited in the disclosure, and thus may be selected and designated based on the demand and design requirements. In other embodiments, the total numbers (e.g., the layers of the dielectric layers and the conductive patterns) of the build-up layers are different. Alternatively, there may be only one build-up layer located over the core layer, the disclosure is not limited thereto.

Back to FIG. 2A and FIG. 2B, in some embodiments, the connectors 120 are located over the edge regions 102 of the circuit board structure 110, where the connectors 120 are divided into multiple groups. For example, eight groups of the connectors 120 (that each group has three connectors 120) are shown in FIG. 2B (denoted as 120A through 120H) for illustrative proposes, where the connectors 120 included in the different groups are respectively referred to as the connectors 120A, the connectors 120B, the connectors 120C, the connectors 120D, the connectors 120E, the connectors 120F, the connectors 120G and connectors 120H; however the disclosure is not limited thereto. The number of the groups of the connectors 120 and the number of the connectors 120 included in each group are not limited to the drawings of the disclosure, and may be selected and designed based on the demand. In some embodiments, the numbers of the connectors 120 respectively included in the different groups are the same, all or partially. In alternative embodiments, the numbers of the connectors 120 respectively included in the different groups are different, all or partially.

In some embodiments, the connectors 120 (e.g., the connectors 120A-120H) each includes a base 121, contacts 122, contacts 123 and circuitry (not shown). In some embodiments, a material of the base 121 includes a dielectric material; for example, a polymer such as PI, PBO, BCB, a nitride such as silicon nitride, an oxide such as silicon oxide, a silicon oxynitride, PSG, BSG, BPSG, a combination thereof or the like. In some embodiments, the circuitry is located in (e.g., embedded in) the base 121, and the contacts 122 and the contacts 123 are distributed over two opposite surfaces 121SP and 121SN (along the direction Z) of the base 121 and exposed for electrically connecting to other features/elements (e.g., other connectors or semiconductor devices), where the contacts 122 each are electrically coupled to a respective one of the contacts 123 through the circuitry inside the base 121. For example, some of the contacts 122 and some of the contacts 123 are distributed over the surface 121SP (which referred to as contacts 122(+) and contact 123(+)), and rest of the contacts 122 and rest of the contacts 123 are distributed over the surface 121SN (which referred to as contacts 122(−) and contacts 123(−)).

Along the direction Z, for one connector 120, one contact 122(−) may be overlapped with a respective one contact 122(+), and one contact 122(−) may be overlapped with a respective one contact 123(+). For example, the contacts 122(−) of one connector 120 (e.g., the connectors 120A-120H) are respectively configured to engage with the contacts 122(+) of another one connector 120 (e.g., the connectors 120A-120H), and the contacts 123(−) of one connector 120 (e.g., the connectors 120A-120H) are respectively configured to engage with the contacts 123(+) of another one connector 120 (e.g., the connectors 120A-120H); and thus these two connectors 120 are electrically coupled to each other through the physical and electrical connections formed between the contacts 122(+) and 122(−) and between the contacts 123(+) and 123(−) by insertion. In the disclosure, the aforementioned insertion involves inserting one connector 120 into another one connector 120 to form physical contact interfaces between their contacts 122 and 123. For example, as shown in the top view of FIG. 2B, the shapes of the connectors 120 are rectangular shapes, however the disclosure is not limited thereto. The shapes of the connectors 120 may be circular, oral, ellipse, square, or any suitable polygonal shape.

The materials of the contacts 122 may be the same as the materials of the contacts 123. For example, the contacts 122 and the contact 123 are made of conductive materials, such as aluminum, titanium, copper, nickel, tungsten, and/or alloys thereof. Alternatively, the materials of the contacts 122 may be different from the materials of the contacts 123, the disclosure is not limited thereto. For illustrative proposes, two contacts 122 and three contacts 123 are shown on each of the surfaces 121SP and 121SN of the base 121 in FIG. 2A; however, the numbers of the contacts 122 and the contacts 123 are not limited thereto, and may be selected and designated based on the demand. The material of the circuitry located in the base 121 may be the same as the material of the internal circuitry 114. For example, circuitry includes a plurality of the metallization layers and a plurality of vias interconnected thereto, where the metallization layers are patterned copper layers, and the vias are copper vias. However, the disclosure is not limited thereto; in an alternative embodiment, the materials of the metallization layers and the vias included in the circuitry are different from the materials of the metallization layers and the vias included in the internal circuitry 114.

As illustrated in FIG. 2A, the connectors 120 (e.g., the connectors 120A-120H) are located over and bonded to the circuit board structure 110 through conductive connectors 61, in some embodiments. For example, the conductive connectors 61 are formed between the contact pads 112 of the circuit board structure 110 and the contacts 122 or the contacts 123 of the connectors 120 (e.g., the connectors 120A-120H). The conductive connectors 61 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 61 may include a conductive material such as solder, copper, aluminum, gold, nickel, silver, palladium, tin, the like, or a combination thereof. In some embodiments, the conductive connectors 61 are formed by initially forming a layer of solder or solder paste through evaporation, electroplating, printing, solder transfer, ball placement, or the like. Once a layer of solder has been formed over the structure, a reflow may be performed in order to shape the material into the desired bump shapes. Through the conductive connectors 61, the connectors 120 (e.g., the connectors 120A-120H) are electrically coupled to the circuit board structure 110, for example, as shown in FIG. 2A.

The conductive connectors 61 are independently in contact with one of the contact pads 112 of the circuit board structure 110 for transmitting the testing electric signals or the responsive electric signals thereto or therefrom, for example, as shown in FIG. 2A. However, the disclosure is not limited thereto; in the disclosure, any two or more than two adjacent conductive connectors 61 may be connected to each other through at least one additional conductive connector 64. For another example, the conductive connectors 61 (respectively connecting to one contact 123(+) and the corresponding one contact pad 112), which are located adjacent to one another along the direction X, are connected (e.g., electrically coupled) to each other by one additional conductive connectors 64, where the additional conductive connector 64 is located over the surface S1, as shown in FIG. 3A. Owing to the additional conductive connectors 64 in addition to the conductive connectors 61, the transmission of testing electric signals or the responsive electric signals are ensured (e.g., via connector signal redundancy). The material of the additional conductive connector 64 may be the same as or the similar to the material of the conductive connectors 61, and thus are omitted herein.

Continued on FIG. 2A and FIG. 2B, in some embodiments, the connectors 140 are located over a region (e.g., the periphery region 101p) outside the device region 101d of the main region 101 of the circuit board structure 110, and the connectors 150 are located over the device region 101d. For example, along the direction Z, the connectors 140 are overlapped with the periphery region 101p and the connectors 150 are overlapped with the device region 101d, as shown in FIG. 2A and FIG. 2B. However, the disclosure is not limited thereto; in some alternative embodiment of which the periphery region 101p is omitted, the connectors 140 are located over the edge regions 102, and the connectors 150 are located over the device region 101d (e.g., the main region 101).

In some embodiments, the connectors 140 and the connectors 150 are independently divided into multiple groups. For example, eight groups of the connectors 140 (that one group has three connectors 140) and eight groups of the connectors 150 (that one group has one connector 150) are shown in FIG. 2B (denoted as 140A through 140H and 150A through 150H) for illustrative proposes, where the connectors 140 included in the different groups are respectively referred to as the connectors 140A, the connectors 140B, the connectors 140C, the connectors 140D, the connectors 140E, the connectors 140F, the connectors 140G and connectors 140H while the connector 150 included in the different groups are respectively referred to as the connector 150A, the connector 150B, the connector 150C, the connector 150D, the connector 150E, the connector 150F, the connector 150G and connector 150H; however the disclosure is not limited thereto. The number of the groups of the connectors 140, 150 and the number of the connectors 140, 150 included in one group are not limited to the drawings of the disclosure, and may be selected and designed based on the demand. In some embodiments, the numbers of the connectors 140, 150 respectively included in the different groups are the same, all or partially. In alternative embodiments, the numbers of the connectors 140, 150 respectively included in the different groups are different, all or partially.

The material and structure of the connectors 140 (individually including a base 141, contacts 142 (e.g., 142(−) and 142(+)), contacts 143 (e.g., 143(−) and 143(+)) and circuitry (not shown)) and the material and structure of the connectors 150 (individually including a base 151, contacts 152 (e.g., 152(−) and 152(+)), contacts 153 (e.g., 153(−) and 153(+)) and circuitry (not shown)) are the same as or similar to the material and structure of the connectors 120 as described above, and thus are not repeated herein for brevity. For example, as shown in the top view of FIG. 2B, the shapes of the connectors 140 and the connectors 150 are rectangular shapes, however the disclosure is not limited thereto. The shapes of the connectors 140 and the connectors 150 may be circular, oral, ellipse, square, or any suitable polygonal shape.

In some embodiments, the connectors 140 are electrically coupled to the connectors 150 through the connecting structures 130, respectively. For example, the connecting structures 130 are located over the main region 101 of the circuit board structure 110, where a portion of one connecting structure 130 is overlapped with the periphery region 101p and other portion thereof is overlapped with the device region 101*d*, along the direction Z. However, the disclosure is not limited thereto; in some alternative embodiment of which the periphery region 101*p* is omitted, a portion of one connecting structure 130 is overlapped with the edge portions 102 and other portion thereof is overlapped with the device region 101*d* (e.g., the main region 101), along the direction Z.

The connecting structures 130 may be divided into multiple groups. For example, four groups of the connecting structures 130 (that one group has one connecting structure 130) are shown in FIG. 2B (denoted as 130A through 130D) for illustrative proposes, where the connecting structures 130 included in the different groups are respectively referred to as the connecting structure 130A, the connecting structure 130B, the connecting structure 130C and the connecting structure 130D; however the disclosure is not limited thereto. The number of the groups of the connecting structures 130 and the number of the connecting structures 130 included in one group are not limited to the drawings of the disclosure, and may be selected and designed based on the demand. In some embodiments, the number of the connecting structures 130 included in the different groups are the same, all or partially. In alternative embodiments, the number of the connecting structures 130 included in the different groups are different, all or partially. For example, as shown in FIG. 2A, the connectors 140A, 140C and the connectors 150A, 150C are electrically coupled to the connecting structure 130A, the connectors 140B, 140D and the connectors 150B, 150C are electrically coupled to the connecting structure 130B, the connectors 140E, 140G and the connectors 150E, 150G are electrically coupled to the connecting structure 130C, and the connectors 140F, 140H and the connectors 150F, 150G are electrically coupled to the connecting structure 130D.

In some embodiments, the connecting structures 130 individually includes a substrate 131, a plurality of contact pads 132, a plurality of contact pads 133, and an internal circuitry 134 including metallization layers and vias (not shown) interconnected. In some embodiments, the contact pads 132 and the contact pads 133 are respectively distributed on two opposite sides of the substrate 131, and are exposed for electrically connecting with later-formed elements/features. The contact pads 132 may be distributed over the surface S3 of the substrate 131, while the contact pads 133 may be distributed over the surface S4 of the substrate 131; or, vice versa. The surface S3 and surface S4 are opposite to each other along the direction Z, for example, as shown in FIG. 2A.

In some embodiments, the internal circuitry 134 (including the metallization layers and the vias) is embedded in the substrate 131 and provides a routing function for the substrate 131, where the metallization layers and the vias included in the internal circuitry 134 are electrically connected to the contact pads 132 and the contact pads 133. That is, the contact pads 132 are electrically coupled to the contact pads 133 through the internal circuitry 134 (including the metallization layers and the vias), for example. On the other hand, in some embodiments, one of the contact pads 132 is also electrically coupled to another contact pad 132 through the internal circuitry 134, and/or one of the contact pads 133 is also electrically coupled to another contact pad 133 through the internal circuitry 134. The connecting structures 130 sometimes may be referred to as an auxiliary testing board.

The material and formation of the contact pads 132 and the material and formation of the contact pads 133 may be the same as or similar to the material and formation of the contact pads 112 and/or 113, the material and formation of the substrate 131 may be the same as or similar to the material and formation of the substrate 111, and the material and formation of the internal circuitry 134 may be the same as or similar to the material and formation of the internal circuitry 114; and thus are omitted herein for simplicity.

For example, as shown in the top view of FIG. 2B, the shapes of the connecting structures 130 are rectangular shapes, however the disclosure is not limited thereto. The shapes of the connecting structures 130 may be a solid shape in a circular, oral, ellipse, square, or any suitable polygonal form or a closed frame shape in a circular, oral, ellipse, square, or any suitable polygonal form. That is, one connecting structure 130 with the closed frame shape (not shown) may be employed, as long as such single connecting structure 130 has a physical structure fulfilled the requirements to properly connecting the connectors 140 and the connectors 150 included the testing module 100A. In other words, such single connecting structure 130 can includes a plurality of portions connected to one another to form a frame shape, where parts of the portions may be equivalent to the connecting structures 130A through 130D.

In some embodiments, as shown in FIG. 2A, the connectors 140 are respectively located over and bonded to the connecting structure 130 through conductive connectors 62, and the connectors 150 are respectively located over and bonded to the connecting structure 130 through conductive connectors 63. The conductive connectors 62 may be formed between the contact pads 133 (distributed over the surface S4) of the connecting structures 130 (e.g., the connecting structures 130A-130D) and the contacts 142 or the contacts 143 of the connectors 140 (e.g., the connectors 140A-140H). For example, the conductive connectors 62 are formed between the contact pads 133 (distributed over the surface S4) of the connecting structures 130 (e.g., the connecting structures 130A, 130B) and the contacts 142 of the connectors 140 (e.g., the connectors 140A, 140B), as shown in FIG. 2A. The conductive connectors 63 may be formed between the contact pads 133 (distributed over the surface S4) of the connecting structures 130 (e.g., the connecting structures 130A-130D) and the contacts 152 or the contacts 153 of the connectors 150 (e.g., the connectors 150A-150H). For example, the conductive connectors 63 are formed between the contact pads 133 (distributed over the surface S4) of the connecting structures 130 (e.g., the connecting structures 130A, 130B) and the contacts 152 of the connectors 150 (e.g., the connectors 150A, 150B), as shown in FIG. 2A. The material and formation of the conductive connectors 62 and the material and formation of the conductive connectors 63 may be the same as or similar to the material and formation of the conductive connectors 61 as described above; and thus, are not repeated herein for brevity. In the same way, any two or more than two adjacent conductive connectors 62 may be connected to each other through at least one additional conductive connector 64 (see FIG. 3B), and/or any two or more than two adjacent conductive connectors 63 may be connected to each other through at least one additional conductive connector 64 (see FIG. 3C).

In some embodiments, the connectors 150 are further electrically coupled to the object to-be-tested by establishing proper physical contact between the contacts 152, 153 and the output terminals of the object to-be-tested (e.g., the semiconductor wafer-form package). In some embodiments, the connectors 140 are further electrically coupled to the connectors 120 through the connecting structures 160. In other words, the connectors 150 can be electrically coupled to the circuit board structure 110 through the connecting structures 130, the connectors 140, the connecting structures 160 and the connectors 120. The connecting structures 160 are located over the circuit board structure 110, where the connecting structures 160 are overlapped with the edge regions 102 and the periphery region 101p, as shown in FIG. 2A and FIG. 2B, for example. The connecting structure 160 may extend from the one edge region 102 to the periphery region 101p adjoining thereto to physically connect to the connectors 120 and the respective connectors 140 for establishing electrical connections between the connectors 150 and the circuit board structure 110. The connecting structures 160 sometimes may be referred to as a bridge connector.

In some embodiments, the connecting structures 160 (e.g., the connecting structure 160A-160H) includes a plurality of conductive wires, such as parallel conductive wires, which means that the conductive wires themselves (individually without considering other elements later-connected) are parallel to one another in electrical connection. For one example, the parallel conductive wires are bare conductive wires (e.g., outer surface thereof being free of dielectric materials) that are parallel to (e.g., not in directly physical contact with) each other via a distance D1. In one example, the distance D1 is greater than or substantially equal to 1.0 cm. For another example, the parallel conductive wires are conductive wires independently wrapped by a dielectric material, and the conductive wire themselves are parallel to (e.g., not in directly physical contact with) each other through at least the dielectric material, and there is the distance D1 presented between the conductive wire themselves. Such distance D1 may exist due to a gap, such as an air gap, a gap fully filling with the dielectric material, or an air gap with partially filling with the dielectric material. Due to the presence of the distance D1 between any two of the parallel conductive wires, it is capable of suppressing crosstalk effect (causing by self-coupling) or electric short at the connecting structures 160, thereby ensuring the reliability of the testing module 100A. For example, the connecting structures 160 are ribbon cables, flexible printed circuits, or the like. For example, as shown in FIG. 2B, one of the connecting structures 160 (e.g., 160A) is employed to electrically couple a respective one connector (120A) and the respective one connector (140A). Similar connections may be applied to the connectors 120B-120H and the connectors 140B-140H through the connecting structures 160AB-160H, respectively.

In some embodiments, as shown in FIG. 2B, the number of the groups of the connectors 120 are the same as the number of the groups of the connectors 140, and the number of the groups of the connectors 140 is different from (e.g., being greater than) the number of the groups of the connectors 150. Through the connecting structures 130, the output terminals (e.g., the contacts 152 and 153) of the connectors 150 may be re-routed to the output terminals (e.g., the contacts 142 and 143) of the connectors 140, where one of the output terminals (e.g., the contacts 152 and 153) of one connector 150 can be re-routed to one or more than one of the output terminals (e.g., the contacts 142 and 143) of one or more than one connector 140. Furthermore, as the number of the groups of the connectors 120 may be the same as the number of the groups of the connectors 140, and the number of the groups of the connectors 140, one of the output terminals (e.g., the contacts 142 and 143) of one connector 140 can be re-routed to one of the output terminals (e.g., the contacts 122 and 123) of one connector 120 through the connecting structures 160. In the above embodiments, the connecting structures 160 individually have N number of input terminals (which connecting to the output terminals of the connectors 140) and M number of the output terminals (which connecting to the output terminals of the connectors 120), where N and M are integrals and N is equal to M.

In alternative embodiments, the number of the groups of the connectors 120 are different from (e.g., being greater than) the number of the groups of the connectors 140, and the number of the groups of the connectors 120 is different from (e.g., being greater than) the number of the groups of the connectors 150. Through the connecting structures 130, the output terminals (e.g., the contacts 152 and 153) of the connectors 150 may be re-routed to the output terminals (e.g., the contacts 142 and 143) of the connectors 140, where one of the output terminals (e.g., the contacts 152 and 153) of one connector 150 can be re-routed to one or more than one of the output terminals (e.g., the contacts 142 and 143) of one or more than one connector 140. Similarly, through the connecting structures 160, the output terminals (e.g., the contacts 142 and 143) of the connectors 140 may be re-routed to the output terminals (e.g., the contacts 122 and 123) of the connectors 120, where one of the output terminals (e.g., the contacts 142 and 143) of one connector 140 can be re-routed to one or more than one of the output terminals (e.g., the contacts 122 and 123) of one or more than one connector 120. In the alternative embodiments, the connecting structures 160 individually have N number of input terminals (which connecting to the output terminals of the connectors 140) and M number of the output terminals (which connecting to the output terminals of the connectors 120), where N and M are integrals and N is less than M.

Continued on FIG. 2A and FIG. 2B, in some embodiments, the circuit board structures 170 are located over and distant from the circuit board structure 110. For example, the circuit board structures 170 are overlapped with the device region 101d of the circuit board structure 110 along the direction Z and on the X-Y plane. In some embodiments, as shown in FIG. 2A, the circuit board structures 170 individually includes a substrate 171, a plurality of contact pads 172, a plurality of contact pads 173, an internal circuitry 174 including metallization layers and vias (not shown) interconnected, and a plurality of pins 175. For example, the contact pads 172 and the contact pads 173 are respectively distributed on two opposite sides of the substrate 171, and are exposed for electrically connecting with later-formed elements/features. The contact pads 172 may be distributed over the surface S5 of the substrate 171, while the contact pads 173 may be distributed over the surface S6 of the substrate 171; or, vice versa. The surface S5 and surface S6 are opposite to each other along the direction Z, for example, as shown in FIG. 2A.

In some embodiments, the internal circuitry 174 (including the metallization layers and the vias) is embedded in the substrate 171 and provides a routing function for the substrate 171, where the metallization layers and the vias included in the internal circuitry 174 are electrically connected to the contact pads 172 and the contact pads 173. That is, the contact pads 172 are electrically coupled to the contact pads 173 through the internal circuitry 174 (including the metallization layers and the vias), for example. On the other hand, in some embodiments, one of the contact pads 172 is also electrically coupled to another contact pad 172 through the internal circuitry 174, and/or one of the contact pads 173 is also electrically coupled to another contact pad 173 through the internal circuitry 174. The pins 175 may be electrically coupled to the substrate 171 through connecting to either the contact pad 172 or the contact pads 173. For example, the pins 175 are distributed over the surface S6 of the substrate 171 and connected to the contact pads 173 located over the surface S6, as shown in FIG. 2A.

The material and formation of the substrate 171 may be the same as or similar to the material and formation of the substrate 111, the material and formation of the contact pads 172 and the material and formation of the contact pads 173 may be the same as or similar to the material and formation of the contact pads 112 and/or 113, and the material and formation of the internal circuitry 174 may be the same as or similar to the material and formation of the internal circuitry 114; and thus are omitted herein for simplicity. The material of the pins 175 may include conductive materials, such as aluminum, titanium, copper, nickel, tungsten, and/or alloys thereof, or the like, in the form of a needle-like structure, bump-like structure or a pillar-like structure.

The circuit board structures 170 may be divided into multiple groups. For example, four groups of the circuit board structures 170 (that one group has one circuit board structure 170) are shown in FIG. 2B (denoted as 170A through 170D) for illustrative proposes, where the circuit board structures 170 included in the different groups are respectively referred to as the circuit board structure 170A, the circuit board structure 170B, the circuit board structure 170C and the circuit board structure 170D; however the disclosure is not limited thereto. The number of the groups of the circuit board structures 170 and the number of the circuit board structures 170 included in one group are not limited to the drawings of the disclosure, and may be selected and designed based on the demand. In some embodiments, the number of the circuit board structures 170 included in the different groups are the same. In alternative embodiments, the number of the circuit board structures 170 included in the different groups are different, all or partially.

For example, as shown in the top view of FIG. 2B, the shapes of the circuit board structures 170 are rectangular shapes, however the disclosure is not limited thereto. The shapes of the circuit board structures 170 may be circular, oral, ellipse, square, or any suitable polygonal shapes. That is, one circuit board structure 170 (not shown) may be employed, as long as such single circuit board structure 170 has a physical structure fulfilled the requirements to properly electrically connecting output terminals of the object to-be-tested (e.g., the semiconductor wafer-form package) for establishing a proper physical contact between the pins 175 and the output terminals of the object to-be-tested (e.g., the semiconductor wafer-form package). In other words, such single circuit board structure 170 can includes a plurality of portions connected to one another to form a plate shape (with or without openings/slits), where parts of the portions may be equivalent to the circuit board structure 170A through 170D. In some embodiments, the circuit board structures 170 include pin girl array (PGA) board. As shown in FIG. 2A, the pins 175 are facing the circuit board structure 110, where the pins 175 protrude from the substrate 171 toward the substrate 111 of the circuit board structure 110, for example. In some embodiments, the connectors 150 (e.g., the connectors 150A-150H) and the circuit board structures 170 (e.g., the circuit board structures 170A-170D) are referred to as terminals of the testing module 100A for establishing a proper physical contact between the testing module 100A and (the output terminals of) the object to-be-tested (e.g., the semiconductor wafer-form package). That is, the circuit board structures 170 are electrically coupled to the circuit board structure 110 through the object to-be-tested (e.g., the semiconductor wafer-form package), the connectors 150, the connecting structures 130, the connectors 140, the connecting structure 160 and the connectors 120, for example.

Continued on FIG. 2A and FIG. 2B, for example, in the testing module 100A, an accommodated space AS is presented as a space surrounded by the circuit board structure 110, the connectors 120, the connecting structures 160, the connectors 140, the connecting structures 130, the connectors 150 and the circuit board structures 170. In some embodiments, the object to-be-tested (e.g., the semiconductor wafer-form package) is placed into the accommodated space AS for performing later testing procedures. As shown in FIG. 2A, the accommodated space AS is at least located over the device region 101$d$ of the circuit board structure 110. In some embodiments, the elastic element 180 is located inside the accommodated space AS and overlapped with the device region 101$d$ of the circuit board structure 110, as shown in FIG. 2A. The elastic element 180 may be distant from the connectors 120 on the X-Y plane by a gap GP. However, the disclosure is not limited thereto; and the elastic element 180 may further extend to the periphery region 101$p$ with or without contacting the connectors 120 on the X-Y plane. In other words, the elastic element 180 is located over the main region 101, and is overlapped with the device region 101$d$ and the periphery region 101$p$ along the direction Z and on the X-Y plane, for example. In one embodiment, the elastic element 180 is located over the device region 101$d$ and the periphery region 101$p$ and in contact with the connectors 120 on the X-Y plane. In another embodiments, the elastic element 180 is located over the device region 101$d$ and the periphery region 101$p$ and distant from the connectors 120 on the X-Y plane.

In some embodiments, as shown in the top view of FIG. 2B, the shape of the elastic element 180 is a circular shape; however, the disclosure is not limited thereto. The shape of the elastic element 180 may be square, rectangular, oral, ellipse, square, or any suitable polygonal shape. In some embodiments, a material of the elastic element 180 include an elastic material capable of dissipating heat, such as a thermal foam, a thermal rubber, or a thermal cushion. Owing to the elastic element 180, the circuit board structure 110 can be protected from damages caused by the physical placement of the object to-be-tested (e.g., the semiconductor wafer-form package); and during testing, the heat generated from the semiconductor wafer-form package can be efficiently transmitted to the circuit board structure 110 for dissipating to the external environment. Due to the elastic element 180, the lifecycle of the testing module 100A is improved. Up to here, the testing module 100A is shown in FIG. 2A and FIG. 2B as an embodiment of the disclosure, where after electrically connecting the controller 300 (e.g., the ATE) with the testing module 100A, the object to-be-tested (e.g., the semiconductor wafer-form package) may be placed into the testing module 100A (e.g., over the elastic element 180 inside the accommodated space AS) for testing the integrated circuits and internal circuitries thereof, see an assembly 10 of FIG. 6A and FIG. 6B (which will be described later).

In one alternative embodiment, as shown in the testing module 100A of FIG. 2A and FIG. 2B, the connecting structures 130 include organic flexible substrates or printed circuit boards; however, the disclosure is not limited thereto. For example, the width as measured along the direction X and the length as measured along the direction Y of the connecting structures 130 are independently greater than or substantially equal to 1.0 cm.

However, the disclosure is not limited thereto, and at least one of connecting structures 130 may be substituted by a connecting structure 130'. In an alternative embodiment of a testing module 100B shown in FIG. 4, the connecting structures 130B is substituted by the connecting structure 130'. In some embodiments, the connecting structure 130' includes a plurality of conductive wire 138, such as parallel conductive wires, connecting the corresponding ones of the connectors 140, 150. The material and structure of the connecting structure 130' (e.g., the conductive wires 138) may be the same as or similar to the material and structure of the connecting structures 160, and thus are not repeating therein for brevity. Similar configuration may also be applied to parts or rest of the connecting structures 130.

In another alternative embodiment, as shown in the testing module 100A of FIG. 2A and FIG. 2B, the connectors 140 and the connectors 150 are located over the same surface S4 of the respective one of the connecting structures 130; however, the disclosure is not limited thereto. The connectors 140 and the connectors 150 may located at two opposite sides (e.g., the surfaces S3 and S4) of the respective one connecting structure 130. In an alternative embodiment of a testing module 100C shown in FIG. 5, the connectors 140A are located over the surface S3 of the connecting structure 130A while the connectors 150A are located over the surface S4 of the connecting structure 130A. Similar configuration may also be applied to parts or rest of the connectors 140, 150.

Figure 6A:
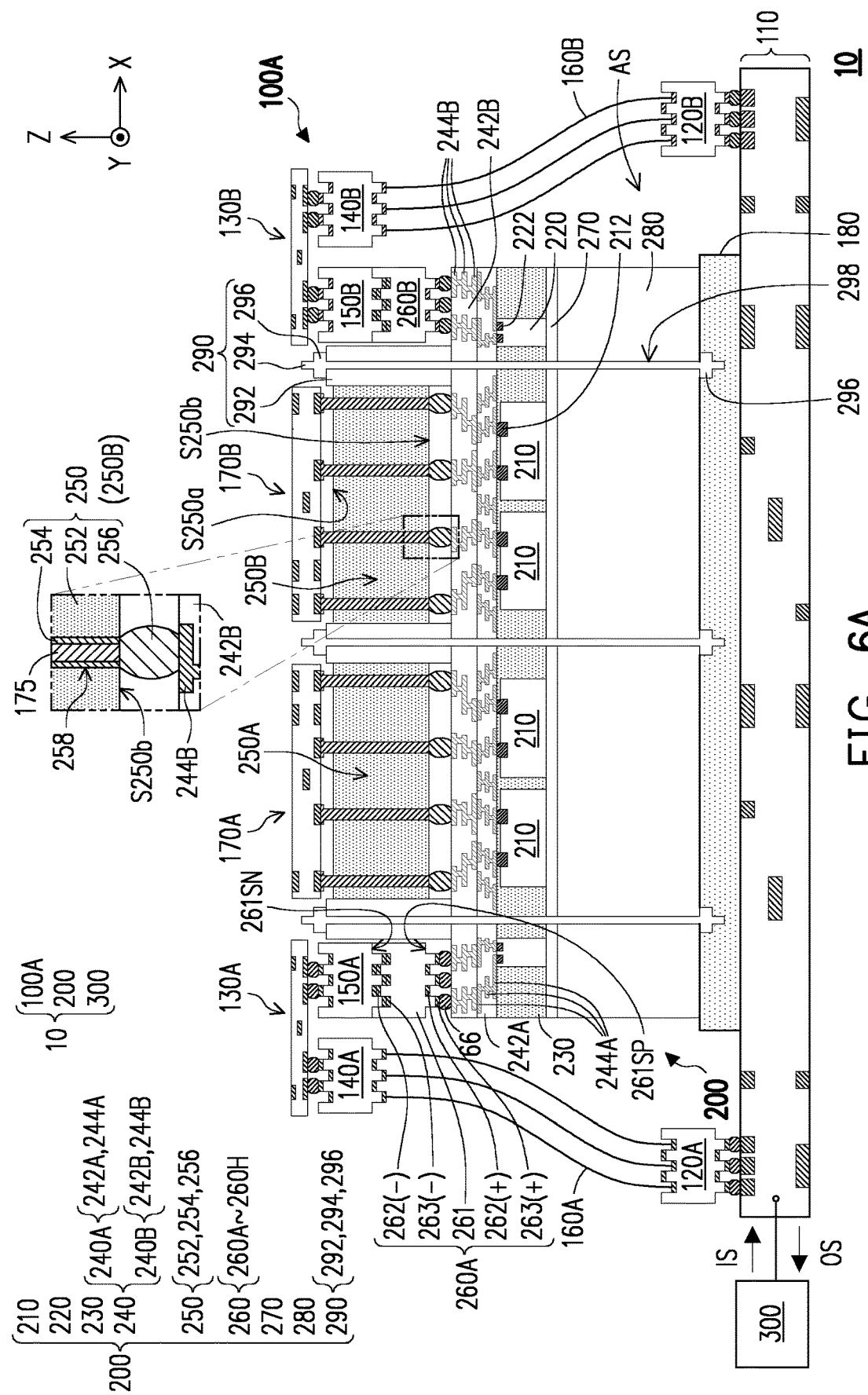
FIG. 6A is a schematic cross-sectional view of an assembly of a testing module and a semiconductor wafer-form package in accordance with some embodiments of the disclosure.
Figure 6B:
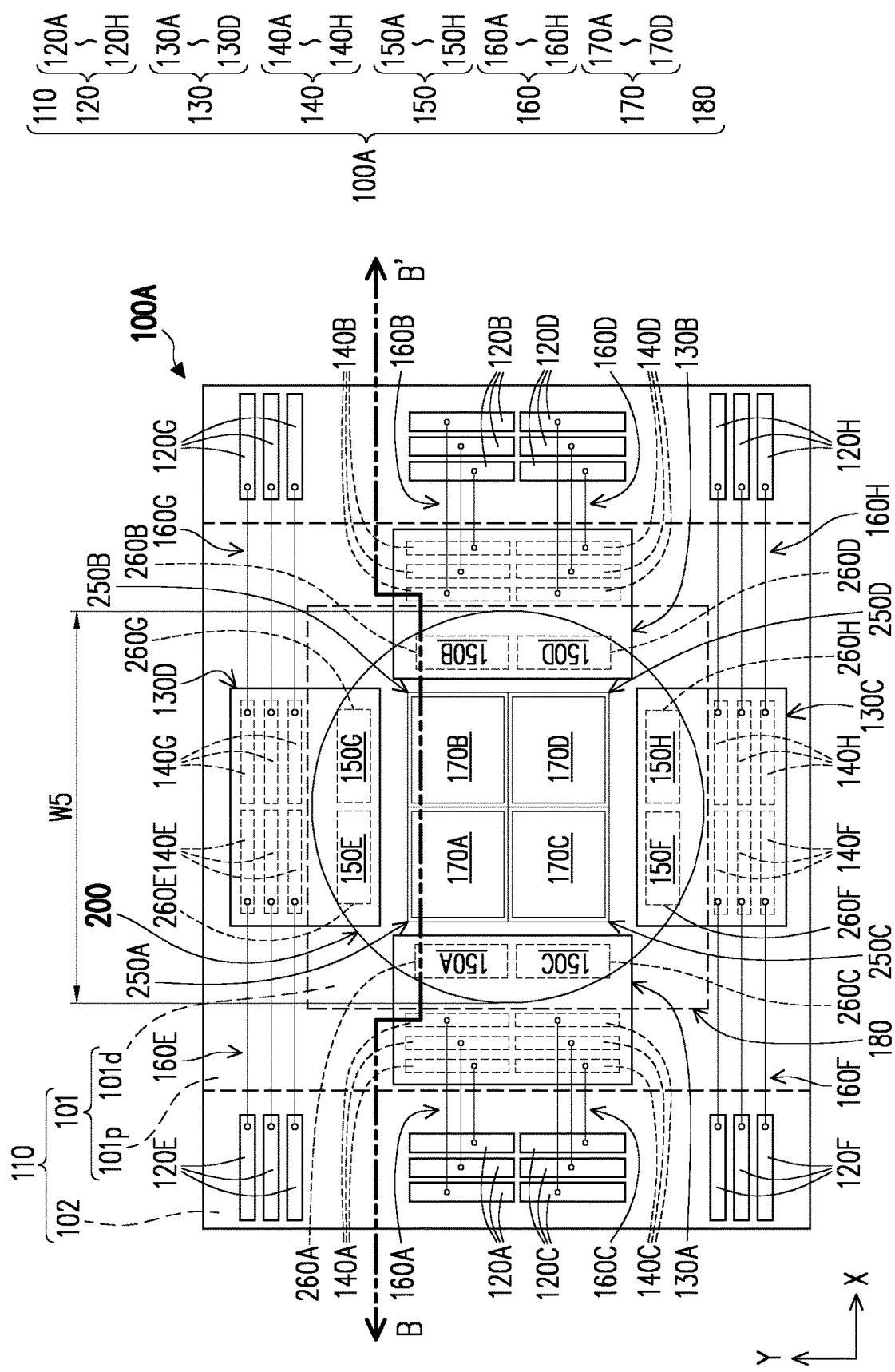
FIG. 6B is a top view illustrating a relative position between the testing module and the semiconductor wafer-form package in the assembly depicted in FIG. 6A.

FIG. 6A and FIG. 6B respectively illustrate a schematic cross-sectional view and a top view of an assembly of a testing module and a semiconductor wafer-form package in accordance with some embodiments of the disclosure, where FIG. 6A is the cross-sectional view taken along a line BB' depicted in FIG. 6B. The elements similar to or substantially the same as the elements described previously will use the same reference numbers, and certain details or descriptions (e.g. the materials, positioning configurations, electrical connection relationships, etc.) of the same elements would not be repeated herein.

In some embodiments, a semiconductor wafer-form package is installed on the testing module, in accordance with step S120 of FIG. 1. For example, as shown in FIG. 6A and FIG. 6B, a semiconductor wafer-form package 200, which is referred to as the object to-be-tested as previously mentioned in FIG. 2A and FIG. 2B, is provided and placed into the accommodated space AS of the testing module 100A and electrically coupled to the testing module 100A to construct the assembly 10. As shown in FIG. 6A, in some embodiments, the semiconductor wafer-form package 200 is located over the elastic element 180 and between the connecting structures 130 (e.g., the connecting structures 130A-130D) and the circuit board structure 110 and between the circuit board structures 170 (e.g., the connecting structures 170A-170D) and the circuit board structure 110 along the direction Z. In some embodiments, as shown in FIG. 6B, the semiconductor wafer-form package 200 is further surrounded by the connectors 150 (e.g., the connectors 150A-150H), the connectors 140 (e.g., the connectors 140A-140H), the connectors 120 (e.g., the connectors 120A-120H) and the connecting structures 160 (e.g., the connecting structures 160A-160H) on the X-Y plane (e.g., the direction X and direction Y). The semiconductor wafer-form package 200 is, for example, overlapped with the device region 101d of the circuit board structure 110 of the testing module 100A. In some embodiments, as shown in the top view of FIG. 6B, the shape of the semiconductor wafer-form package 200 is a circular shape. For example, a maximum width W5 of the semiconductor wafer-form package 200 is greater than or substantially greater than 6 inches.

In some embodiments, the semiconductor wafer-form package 200 includes a plurality of semiconductor dies 210, a plurality of input/output (I/O) interface dies 220, an insulating encapsulation 230, a redistribution circuit structure 240, at least one socket 250 (e.g., 250A through 250D), a plurality of connectors 260 (e.g., 260A through 260H), a thermal adhesive 270 and a thermal dissipating element 280. For example, the sockets 250 and the connectors 260 are the interfaces for external connections to the semiconductor wafer-form package 200. That is, the sockets 250 and the connectors 260 serve as the output terminals of the semiconductor wafer-form package 200 to electrical connect with the external devices/apparatus (e.g., the testing module 100A) to form the assembly 10. In the disclosure, in the assembly 10, for example, the electric signals are in and out of the semiconductor wafer-form package 200 through the sockets 250 and the connectors 260, and the electric signals are in and out of the testing module 100A (from/to the semiconductor wafer-form package 200) through the connectors 150 and the circuit board structures 170. In some embodiments, as shown in FIG. 6A, the semiconductor wafer-form package 200 is electrically coupled to the testing module 100A via temporarily physical engagement, such as through engaging (e.g., removably inserting) the circuit board structures 170 to the sockets 250 and engaging (e.g., removably inserting) the connectors 150 to the connectors 260. Due to such electrical connection between the testing module 100A and the semiconductor wafer-form package 200 in the assembly 10, the semiconductor wafer-form package 200 is able to be tested via the testing module 100A which is electrically connected to the controller 300 (e.g., the ATE), as shown in FIG. 6A, for example. In some embodiments, one socket 250 is engaged with a respective one circuit board structure 170, where the conductive connectors 256 included in the socket 250 are electrically coupled through the respective one circuit board structure 170; therefore, the circuit board structures 170 sometimes may be referred to as a bridge connector.

For example, in the assembly 10, the testing electric signal(s) (indicated by IS in FIG. 6A) is generated from the controller 300 and transmitted to (e.g., sending to) the testing module 100A, where the testing electric signal(s) IS is further transmitted to the semiconductor wafer-form package 200 for testing the integrated circuits and internal circuitries of the semiconductor wafer-form package 200 through the testing module 100A. In some embodiments, such testing electric signal(s) IS is referred to as a testing signal (which may be a current signal, a voltage signal, or any other test signal used for measuring electrical characteristics of the semiconductor wafer-form package 200) that is propagated from the controller 300, by way of the testing module 100A, to the semiconductor wafer-form package 200. For example, in the assembly 10, the responsive electric signal(s) (indicated by OS in FIG. 6A) is feedback from the semiconductor wafer-form package 200 and transmitted to (e.g., sending to) the testing module 100A, where the responsive electric signal(s) OS is further transmitted to the controller 300 for evaluating the test results through the testing module 100A. In some embodiments, such responsive electric signal(s) OS is referred to as a loopback (or feedback) signal that is returned to the controller 300, by way of the testing module 100A, from the semiconductor wafer-form package 200. In some embodiments, the responsive electric signal OS is independently evaluated before sending out another testing electric signal IS. However, the disclosure is not limited thereto. Alternatively, testing electric signals IS may be sent out in sequence and responsive electric signals OS thereof may be collected and saved in the memory device electrically connected/coupled to the controller 300; and then, the responsive electric signals OS may be evaluated at once in the end of the testing. The evaluation may be performed by comparing one testing electric signal and its responsive electric signal.

The semiconductor dies 210 and the I/O interface dies 220 may be arranged aside to each other along the direction X. The semiconductor dies 210 and the I/O interface dies 220 may be arranged aside to each other along the direction Y. In some embodiments, the semiconductor dies 210 and the I/O interface dies 220 are arranged in the form of a matrix, such as the N×N array or N×M arrays (N, M>0, N may or may not be equal to M). However, the disclosure is not limited thereto, in an alternative embodiment, the semiconductor dies 210 are arranged in the form of a matrix, such as the N×N array or N×M arrays (N, M>0, N may or may not be equal to M), while the I/O interface dies 220 are arranged to surround the semiconductor dies 210 (arranged into the array/matrix) for providing additional input/output circuitries thereto, and thus more I/O counts are provided to the semiconductor dies 210.

In some embodiments, the I/O interface dies 220 independently have a plurality of conductive vias 222, where the conductive vias 222 serve as conductive terminals of the I/O interface dies 220 for electrical connection to other devices/elements. In some embodiments, the semiconductor dies 210 have a plurality of conductive vias 212, where the conductive vias 212 serve as conductive terminals of the semiconductor dies 210 for electrical connection to other devices/elements. The semiconductor dies 210 described herein may be referred to as a semiconductor chip or an integrated circuit (IC). For example, the semiconductor dies 210, independently, are a logic chip, such as a central processing unit (CPU), graphics processing unit (GPU), system-on-a-chip (SoC), microcontroller, or the like. However, the disclosure is not limited thereto; in alternative embodiments, the semiconductor dies 210, independently, are a digital chip, analog chip or mixed signal chip, such as an application-specific integrated circuit ("ASIC") chip, a sensor chips, wireless and radio frequency (RF) chip, a memory chip or a voltage regulator chip. In further alternative embodiments, the semiconductor dies 210, independently, are referred to as a chip or an IC of combination-type, such as a WiFi chip simultaneously including both of a RF chip and a digital chip.

As shown in FIG. 6A, only four semiconductor dies 210 and two I/O interface dies 220 are presented for illustrative purposes, however, it should be noted that the number of the semiconductor dies 210 and the number of the I/O interface dies 220 may be one or more than one, the disclosure is not limited thereto.

In some embodiments, the semiconductor dies 210 and the I/O interface dies 220 are encapsulated in the insulating encapsulation 230. The insulating encapsulation 230 laterally wrapped around the semiconductor dies 210 and the I/O interface dies 220, where the conductive vias 212 of the semiconductor dies 210 and the conductive vias 222 of the I/O interface dies 220 are exposed by the insulating encapsulation 230, for example, as shown in FIG. 6A. The insulating encapsulation 230 may include an acceptable insulating encapsulation material. The insulating encapsulation 230, for example, includes polymers (such as epoxy resins, phenolic resins, silicon-containing resins, or other suitable resins), dielectric materials, or other suitable materials. The insulating encapsulation 230 may be a molding compound formed by a molding process. The insulating encapsulation 230 may further include inorganic filler or inorganic compound (e.g. silica, clay, and so on) which can be added therein to optimize coefficient of thermal expansion (CTE) of the insulating encapsulation 230. The disclosure is not limited thereto.

In some embodiments, a redistribution circuit structure 240 is formed over the semiconductor dies 210, the I/O interface dies 220 and the insulating encapsulation 230. As shown in FIG. 6A, the redistribution circuit structure 240, for example, includes a fine-featured portion 240A and a coarse-featured portion 240B, and is electrically connected to the semiconductor dies 210 and the I/O interface dies 220 through connecting to the conductive vias 212 of the semiconductor dies 210 and the conductive vias 222 of the I/O interface dies 220 exposed by the insulating encapsulation 230. In some embodiments, the fine-featured portion 240A is located between the coarse-featured portion 240B and the semiconductor dies 210 and between the coarse-featured portion 240B and the I/O interface dies 220. In some embodiments, the fine-featured portion 240A of the redistribution circuit structure 240 is formed over and electrically coupled to the semiconductor dies 210 and the I/O interface dies 220, where the coarse-featured portion 240B is electrically coupled to the semiconductor dies 210 and the I/O interface dies 220 through the fine-featured portion 240A.

For example, the fine-featured portion 240A includes a dielectric structure 242A and a metallization pattern 244A located in the dielectric structure 242A, and the coarse-featured portion 240B includes a dielectric structure 242B and a metallization pattern 244B located in dielectric structure 242B. The metallization patterns 244A, 244B independently may include one or more patterned conductive layers (which being individually referred to as redistribution layers or redistribution lines having line portions (also referred to as conductive lines or traces) on and extending on the X-Y plane and via portions (also referred to as conductive vias) extending on the direction Z), and the dielectric structures 242A, 242B independently may include one or more dielectric layers arranged alternatively with the patterned conductive layers. The number of the dielectric layers included in one dielectric structure 242A or 242B and the number of the patterned conductive layers included in one metallization pattern 244A or 244B may not be limited to the drawings of the disclosure, and may be selected and designated based on the demand and design requirements.

The fine-featured portion 240A and the coarse-featured portion 240B of the redistribution circuit structure 240 include metallization patterns and dielectric structures of differing sizes, as shown in FIG. 6A, for example. In certain embodiments, the patterned conductive layers included in the metallization pattern 244A are formed from a same conductive material, and are formed to a same thickness (e.g., a first thickness) and a same line width (e.g., a first line width), and the patterned conductive layers included in the metallization pattern 244B are formed from a same conductive material, and are formed to a same thickness (e.g., a second thickness) and a same line width (e.g., a second line width). Likewise, in some embodiments, the dielectric layer included in the dielectric structure 242A are formed from a same dielectric material, and are formed to a same thickness, and the dielectric layer included in the dielectric structure 242B are formed from a same dielectric material, and are formed to a same thickness. In some embodiments, along the direction Z, the patterned conductive layers included in the metallization pattern 244A have the first thickness that is smaller than the second thickness of the patterned conductive layers included in the metallization pattern 244B. On the other hand, on the top view (e.g., on the X-Y plane), the patterned conductive layers included in the metallization pattern 244A have the first line width that is smaller than the second line width of the patterned conductive layers included in the metallization pattern 244B.

The material of the dielectric structures 242A, 242B may include polyimide, epoxy resin, acrylic resin, phenol resin, BCB, PBO, or any other suitable polymer-based dielectric material, and may be formed by deposition, lamination or spin-coating. The material of the metallization patterns 244A, 244B may include aluminum, titanium, copper, nickel, tungsten, and/or alloys thereof, and may be formed by electroplating or deposition. The disclosure is not limited thereto. The dielectric the dielectric structures 242A, 242B and the metallization patterns 244A, 244B independently may also be patterned by a photolithography and etching process. The material of the dielectric structure 242A is, for example, as the same as the material of the dielectric structure 242B. For another example, the materials of the dielectric structures 242A and 242B are different from one another. The material of the metallization pattern 244A is, for example, as the same as the material of the metallization pattern 244B. For another example, the materials of the metallization patterns 244A and 244B are different from one another. The disclosure is not limited thereto.

In some embodiments, as shown in FIG. 6A, the fine-featured portion 240A is capable of providing local electrical communications between the semiconductor dies 210, between the I/O interface dies 220 and between the semiconductor dies 210 and the I/O interface dies 220, while the coarse-featured portion 240B is capable of providing global electrical communications between external devices/apparatus electrically connected to the sockets 250 and/or the connectors 260 and the semiconductor dies 210 and/or the I/O interface dies 220.

However, the disclosure is not limited thereto. In alternative embodiments, the redistribution circuit structure 240 may include metallization patterns of same size and dielectric structures of same size.

Continued on FIG. 6A and FIG. 6B, in some embodiments, the sockets 250 and the connectors 260 are attached to the redistribution circuit structure 240. For example, four sockets 250 (e.g., 250A through 250D) and eight connectors 260 (e.g., 260A through 260H) are shown in FIG. 6B for illustrative proposes, however the disclosure is not limited thereto. The number of the sockets 250 and the number of the connectors 260 are not limited to the drawings of the disclosure, and may be selected and designed based on the demand. The number of the sockets may be one or more than one, and the number of the connectors 260 may be eight, less than eight or more than eight.

In some embodiments, the sockets 250 independently include a base 252, a plurality of conductive liners 254 and a plurality of conductive connectors 256, as shown in FIG. 6A. A plurality of through holes 258 are formed in the base 252 and extend from a side (e.g. a surface S7) of the base 252 to an opposite side (e.g., a surface S8) of the base 252, in some embodiments. For example, the through holes 258 are formed in the base 252, where the through holes 258 individually penetrate through the base 252, the conductive liners 254 are respectively formed on sidewalls of the through holes 258, and the conductive connectors 256 are formed on the surface S8 of the base 252 underneath a respective one through hole 258 and are electrically coupled to the conductive liner 254 formed on the sidewall of the respective one through hole 258, see FIG. 7A. The conductive connectors 256 are accessibly revealed by the through holes 258 formed in the base 252 along the direction Z, as viewing from the surface S7 toward the surface S8. The conductive connectors 256 may be electrically isolated from one another In some embodiments, the sockets 250 are bonded to the redistribution circuit structure 240 through the conductive connectors 256, where the conductive connectors 256 are located between the base 252 and the redistribution circuit structure 240. The conductive liners 254 are electrically coupled to the redistribution circuit structure 240 through the conductive connectors 256, for example.

In some embodiments, the material of the base 252 include a dielectric material capable of providing a specific stiffness that ensuring the physical and mechanical strength of the sockets 250. The stiffness (which may be quantified by its Yong's modulus) can be in the range of about 10 GPa to about 30 GPa. The conductive liners 254 may be made of a conductive material, such as metal or metal alloy, formed by electroplating or electroless plating, the disclosure is not limited thereto. The material and formation of the conductive connectors 256 may be the same or similar to the material and formation of the conductive connectors 61/62/63 as described in FIG. 2A, and thus are not repeated herein for simplicity.

Figure 7B:
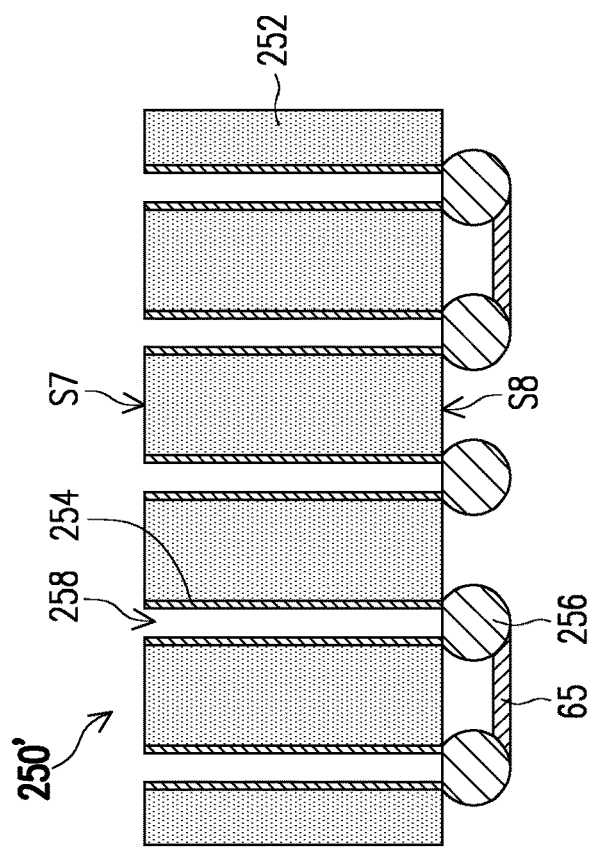
FIG. 7A and FIG. 7B are enlarged, schematic cross-sectional views of a portion of the semiconductor wafer-form package in accordance with some embodiments of the disclosure.
Figure 7A:
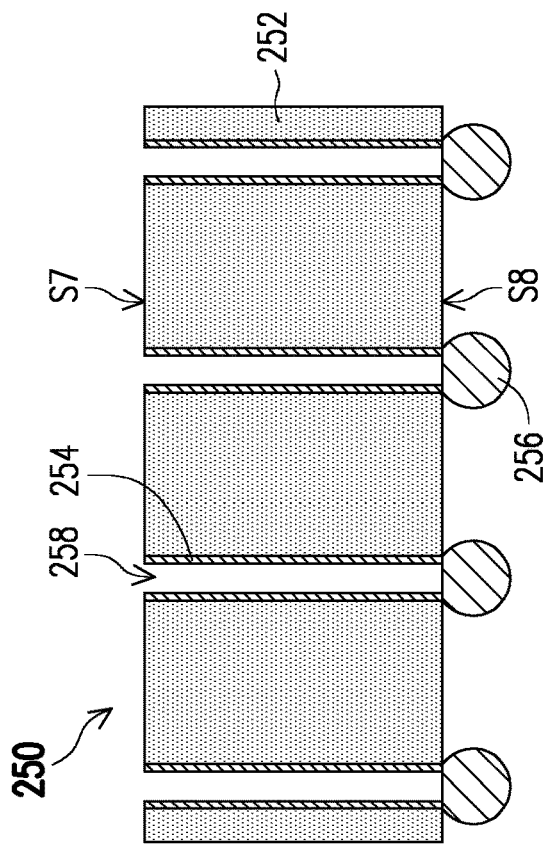

However, the disclosure is not limited thereto, and one or more than one of the sockets 250 depicted in FIG. 6A or FIG. 7A may be replaced by a socket 250' shown in FIG. 7B. In alternative embodiments, the socket 250' depicted in FIG. 7B is similar to the socket 250 depicted in FIG. 7A; the difference is that, any two or more than two adjacent conductive connectors 256 may be connected to each other through at least one additional conductive connector 65. Owing to the conductive connectors 65, the transmission of signals (e.g., the testing electric signals or the responsive electric signals) through the socket 250' are ensured (e.g., via connector signal redundancy). The material of the additional conductive connector 65 may be the same as or the similar to the material of the conductive connectors 64 as described in FIG. 3A through FIG. 3C, and thus are omitted herein.

In some embodiments, the sockets 250 are divided into multiple groups, as shown in FIG. 6B. For example, four groups of the sockets 250 (that one group has one socket 250) are shown in FIG. 6B (denoted as 250A through 250D) for illustrative proposes, where the sockets 250 included in the different groups are respectively referred to as the socket 250A, the socket 250B, the socket 250C and the socket 250D; however the disclosure is not limited thereto. The number of the groups of the sockets 250 and the number of the sockets 250 included in one group are not limited to the drawings of the disclosure, and may be selected and designed based on the demand.

In some embodiments, the sockets 250 are arranged in the form of a matrix, such as the N×N array or N×M arrays (N, M>0, N may or may not be equal to M). The arrangement of the circuit board structures 170 may be similar to the arrangement of the sockets 250, such that the circuit board structure 170 can be able to engage with the sockets 250 through removably inserting the pins 175 into the through holes 258 and rendering a sufficient physical-contact with the liner 254 and the conductive connectors 256, thereby establishing a proper electrical connection between the circuit board structures 170 and the sockets 250. As shown in FIG. 6A and FIG. 6B, the sockets 250 are respectively overlapped with the circuit board structures 170 along the direction Z and on the X-Y plane, for example. In some embodiments, the number of the sockets 250 may be the same as the number of the circuit board structures 170, where the positioning locations of the circuit board structures 170 (e.g., 170A-170D) are respectively located within positioning locations of sockets 250 (e.g., 250A-250D). However, the disclosure is not limited thereto, and in other alternative embodiments, the number of the sockets 250 may be the different from the number of the circuit board structures 170, where positioning locations of the circuit board structures 170 (e.g., 170A-170D) are located within a positioning location of the same socket 250. In further alternative embodiments, the number of the sockets 250 may be the different from the number of the circuit board structures 170, where positioning locations of some of the circuit board structures 170 are respectively located within positioning locations of some of the sockets 250, and positioning locations of rest of the circuit board structures 170 are located within a positioning location of one same socket 250. For example, as shown in the top view of FIG. 6B, the shapes of the sockets 250 are a square shape, however the disclosure is not limited thereto. The shapes of the sockets 250 may be rectangular, circular, oral, ellipse, or any suitable polygonal shape.

In some embodiments, the connectors 260 are arranged aside of the sockets 250, and are electrically connected to the redistribution circuit structure 240. As shown in FIG. 6B, the connectors 260 surround the sockets 250. In some embodiments, the connectors 260 are divided into multiple groups, as shown in FIG. 6B. For example, eight groups of the connectors 260 (that one group has one connector 260) are shown in FIG. 6B (denoted as 260A through 260H) for illustrative proposes, where the connector 260 included in the different groups are respectively referred to as the connector 260A, the connector 260B, the connector 260C, the connector 260D, the connector 260E, the connector 260F, the connector 260G and connector 260H; however the disclosure is not limited thereto. The number of the groups of the connectors 260 and the number of the connectors 260 included in one group are not limited to the drawings of the disclosure, and may be selected and designed based on the demand as long as the number of the connectors 260 and the number of the connectors 150 are matched. In some embodiments, the numbers of the connectors 260 respectively included in the different groups are the same, all or partially. In alternative embodiments, the numbers of the connectors 260 respectively included in the different groups are different, all or partially.

The material and structure of the connectors 260 (individually including a base 261, contacts 262 (e.g., 262(−) and 262(+)), contacts 263 (e.g., 263(−) and 263(+)) and circuitry (not shown)) are the same as or similar to the material and structure of the connectors 120 as described above, and thus are not repeated herein for brevity. In some embodiments, the connectors 260, individually, are bonded to the redistribution circuit structure 240 through, via conductive connectors 66, connecting the contacts 262 or 263 to the metallization patterns of the redistribution circuit structure 240. For example, as shown in FIG. 6A, the connectors 260 are electrically coupled to the redistribution circuit structure 240 through connecting the contacts 263(+) to the metallization pattern 244B of the redistribution circuit structure 240 via the conductive connectors 66. The material and formation of the conductive connectors 66 may be the same as or similar to the material and formation of the conductive connectors 61 as described above; and thus, are not repeated herein. However, the disclosure is not limited thereto; in alternative embodiments (not shown), any two or more than two adjacent conductive connectors 66 may be connected to each other through at least one additional conductive connector 64 in the way similar to the method of which applied on the conductive connectors 61-63.

As shown in FIG. 6A and FIG. 6B, the connectors 260 are independently overlapped with a corresponding one of the connectors 150 overlying thereto along the direction Z and on the X-Y plane, for example. In some embodiments, as shown in the top view of FIG. 6B, a positioning location of one connector 150 (e.g., any one of 150A-150H) are corresponding to (e.g., located over) a positioning location of one connector 260 (e.g., any one of 260A-260H) underlying thereto. For example, as shown in the top view of FIG. 6B, the shapes of the connectors 260 are rectangular shapes, however the disclosure is not limited thereto as long as the connectors 260 and the connectors 150 are able to be engaged to each other for establishing the physical and electrical connections therebetween. The shapes of the connectors 260 may be circular, oral, ellipse, square, or any suitable polygonal shape. In some embodiments, the connectors 260 are engaged with the connectors 150 through removably inserting the contacts 153(+) of one connector 150 (e.g., 150A) into a respective one connector 260 (e.g., 260A) and removably inserting the contacts 262(−) of the respective one connector 260 (e.g., 260A) into the connector 150 (e.g., 150A), which renders a sufficient physical-contact between the contacts 153(+) and the contacts 263(−) and between the contacts 152(+) and the contacts 262(−), thereby establishing a proper electrical connection between the connector 150A and the connector 260A. Similar connections may be applied to the connectors 150B through 150H and the connectors 260B through 260H, respectively.

Back to FIG. 6A, in some embodiments, the thermal dissipating element 280 is attached to the semiconductor dies 210, the I/O interface dies 220 and the insulating encapsulation 230 through the thermal adhesive 270. For example, along the direction Z, the thermal adhesive 270 is located between the insulating encapsulation 230 (encapsulating the semiconductor dies 210 and the I/O interface dies 220) and the thermal dissipating element 280, the insulating encapsulation 230 is located between the redistribution circuit structure 240 and the thermal adhesive 270, and the redistribution circuit structure 240 is located between the sockets 250 (arranged aside of the connectors 260) and the insulating encapsulation 230. In some embodiments, the thermal dissipating element 280 is adhered to the insulating encapsulation 230, the semiconductor dies 210 and the I/O interface dies 220 through the thermal adhesive 270, where the thermal adhesive 270 further helps to dissipate heat from the semiconductor dies 210 and the I/O interface dies 220 to the thermal dissipating element 280, thereby helping to maintain a lower temperature in the semiconductor wafer-form package 200. That is, in the semiconductor wafer-form package 200, the thermal dissipating element 280 is thermally coupled to the semiconductor dies 210 and the I/O interface dies 220 encapsulated in the insulating encapsulation 230 through the thermal adhesive 270.

The thermal dissipating element 280 may have a high thermal conductivity, for example, between about 200 W/m·K to about 400 W/m·K or more, and may be formed using a metal, a metal alloy, and the like. In some embodiments, the thermal dissipating element 280 includes a heat sink, a heat spreader, a cold plate, or the like. The thermal dissipating element 280 can provide physical protection to the semiconductor wafer-form package 200 in addition to the functionality of dissipating heat. The thermal adhesive 270 may comprise any suitable thermally conductive material, for example, a polymer having a good thermal conductivity, which may be between about 3 W/m·K to about 10 W/m·K or more.

The semiconductor wafer-form package 200 may further include a fastening component 290 to secure a mechanical strengthen of the whole structure thereof. For example, as shown in FIG. 6A, the fastening component 290 include a mechanical brace 292, a plurality of bolts 294 and a plurality of fasteners 296. The mechanical brace 292 is a rigid support that may be formed from a material with a high stiffness, such as a metal, e.g., steel, titanium, cobalt, or the like. For example, the mechanical brace 292 is in the form of a solid plate with a plurality of openings formed therein, where the openings allow the placements of the sockets 250. The mechanical brace 292 physically engages portions (sidewalls) of the sockets 250 for securing the sockets 250. Owing to the fastening component 290, warpage of the semiconductor wafer-form package 200, such as that induced by changes in temperature, pressure or humidity, may be reduced. However, the disclosure is not limited thereto, in order to further securing the sockets 250, the mechanical brace 292 may include a plurality of protrusions extending onto parts of the surfaces S250a of the sockets 250. In some embodiments, the connects 260 surround the perimeter of the fastener component 290.

For example, as shown in FIG. 6A, the mechanical brace 292 is placed on the redistribution circuit structure 240 along the direction Z and is adjacent to the sockets 250 along the direction X and the direction Y. In some embodiments, the bolts 294 are threaded through a plurality of bolt holes 298 formed in the semiconductor wafer-form package 200, where the bolt holes 298 independently penetrate through the mechanical brace 292, the redistribution circuit structure 240, the insulating encapsulation 230, the thermal adhesive 270 and the thermal dissipating element 280. In some embodiments, the fasteners 296 are threaded onto the bolts 294 and tightened, where the redistribution circuit structure 240, the insulating encapsulation 230 (encapsulating the semiconductor dies 210 and the I/O interface dies 220) and the thermal adhesive 270 are together clamped between the thermal dissipating element 280 and mechanical brace 292. The fasteners 296 may be, e.g., nuts that thread to the bolts 294. For example, the fasteners 296 attach to the bolts 294 at both sides of the semiconductor wafer-form package 200 (e.g., at the side having the thermal dissipating element 280 (sometimes referred to as a back side of the semiconductor wafer-form package 200) and at the side having the mechanical brace 292 (sometimes referred to as a front side of the semiconductor wafer-form package 200)). After the mechanical brace 292 is secured, it laterally surrounds the sockets 250, in some embodiments.

As shown in FIG. 6A, after the semiconductor wafer-form package 200 is installed to the testing module 100A; in such assembly 10, the semiconductor wafer-form package 200 is in physical contact with the elastic element 180 and forms temporarily electrical connections with the testing module 100A through the connectors 150 and the connectors 260 in addition to the circuit board structures 170 and the sockets 250, where the elastic element 180 protects the circuit board structure 110 from being damaged by the bolts 294 protruding from the back side of the semiconductor wafer-form package 200. With such electrical connections between the testing module 100A and the semiconductor wafer-form package 200, the semiconductor wafer-form package 200 is prepared to be tested by using the testing module 100A electrically connected to the controller 300, for example.

As discussed further below, for the testing method using the testing module 100A, the assembly 10 may have several possible testing electrical transmitting paths to test the semiconductor wafer-form package 200. For example, twelve possible testing electrical transmitting paths P1 through P12 are shown in FIG. 8 through FIG. 11B for illustrative purposes, however the disclosure is not limited herein. More possible testing electrical transmitting paths may be employed in the assembly 10 by using the testing module 100A. FIG. 8, FIG. 9, FIG. 10A through FIG. 10B, and FIG. 11A through FIG. 11B are independently schematic views showing possible testing electrical transmitting paths existing in the assembly 10 depicted in FIG. 6A. The elements similar to or substantially the same as the elements described previously will use the same reference numbers, and certain details or descriptions (e.g. the materials, positioning configurations, electrical connection relationships, etc.) of the same elements would not be repeated herein. In some embodiments, an automated test sequence on the semiconductor wafer-form package is performed through the testing module, in accordance with step S130 of FIG. 1.

Figure 8:
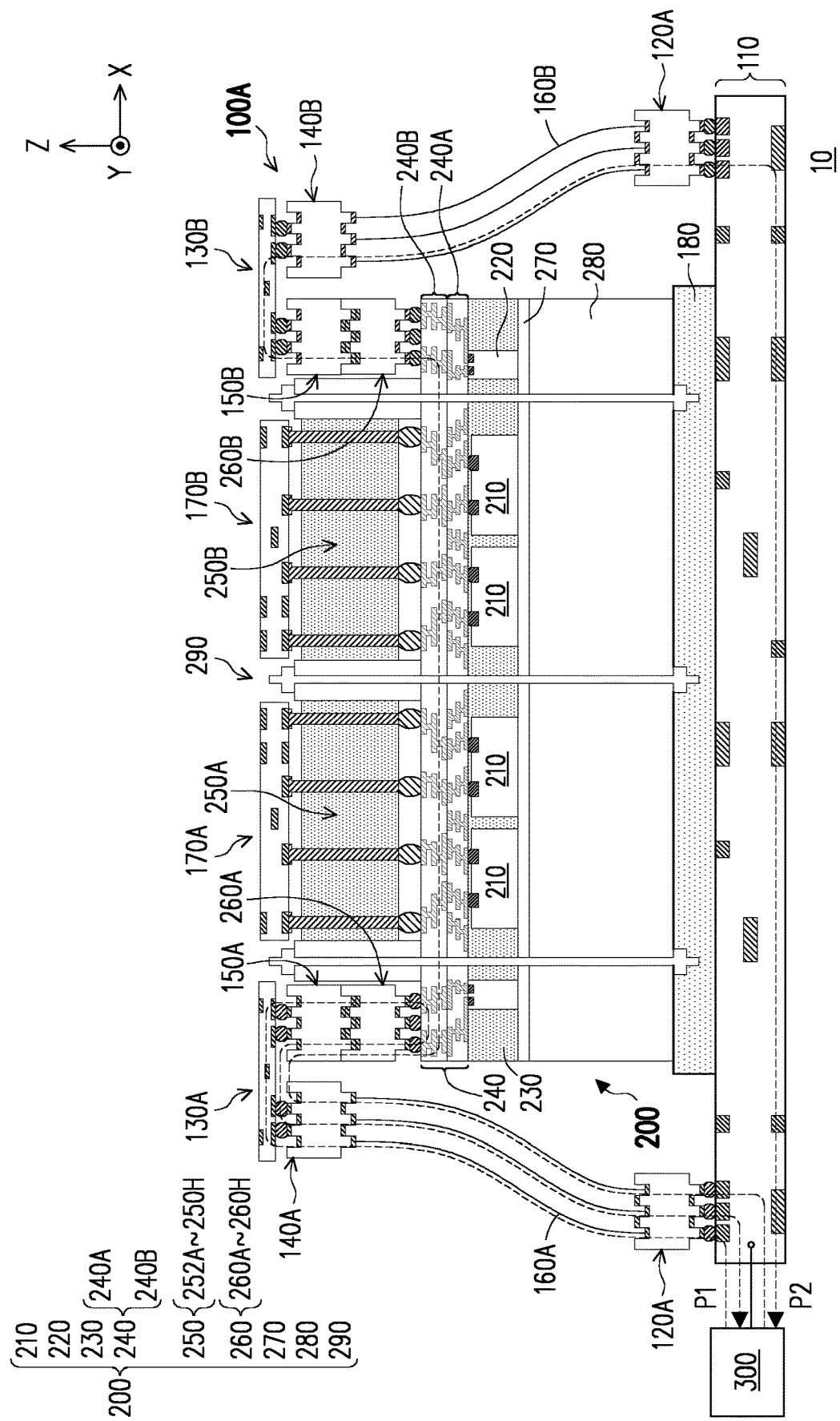
FIG. 8 is a schematic view showing possible testing electrical transmitting paths in accordance with some embodiments of the disclosure.

In some embodiments, the assembly 10 depicted in FIG. 6A (including the testing module 100A electrically connected to the controller 300 and the semiconductor wafer-form package 200) is illustrated in FIG. 8 to demonstrate the testing electrical transmitting paths P1 and P2 which are employed for testing whether there is a sufficient contact between the connectors 260 (e.g., the contacts 262, 263 included in the connectors 260A through 260H) and the redistribution circuit structure 240 (e.g., the metallization pattern 244B of the coarse-featured portion 240B) of the semiconductor wafer-form package 200 to render proper electrical connection therebetween. For one example, as shown in FIG. 8, via the testing electrical transmitting path P1, an electric signal (e.g., the testing electric signal IS) is sent from the controller 300 to the semiconductor wafer-form package 200 by way of the circuit board structure 110, the connector 120A, the connecting structure 160A, the connector 140A, the connecting structure 130A, the connector 150A, the connector 260A and the coarse-featured portion 240B of the redistribution circuit structure 240; and the electric signal (e.g., the responsive electric OS, sometimes referred to as a loopback (feedback) signal) is sent from the semiconductor wafer-form package 200 to the controller 300 by way of the above components in the reversed order (e.g., the coarse-featured portion 240B of the redistribution circuit structure 240, the connector 260A, the connector 150A, the connecting structure 130A, the connector 140A, the connecting structure 160A, the connector 120A and the circuit board structure 110). If the connector 260A is not making sufficient contact with the coarse-featured portion 240B of the redistribution circuit structure 240 to provide electrical coupling, then the electric signal attempting to traverse the above-described path would not be able to reach to the semiconductor wafer-form package 200. If, on the other hand, the electric signal does reach to the semiconductor wafer-form package 200 and return to the controller 300, then it may be concluded that the sufficient contact between the connector 260A and the coarse-featured portion 240B of the redistribution circuit structure 240 is rendered.

Continued on FIG. 8, for another example, via the testing electrical transmitting path P2, an electric signal (e.g., IS) is sent from the controller 300 to the semiconductor wafer-form package 200 by way of the circuit board structure 110, the connector 120A, the connecting structure 160A, the connector 140A, the connecting structure 130A, the connector 150A, the connector 260A and the coarse-featured portion 240B of the redistribution circuit structure 240; and the electric signal (e.g., OS) is sent from the semiconductor wafer-form package 200 to the controller 300 by way of the coarse-featured portion 240B of the redistribution circuit structure 240, the connector 260B, the connector 150B, the connecting structure 130B, the connector 140B, the connecting structure 160B, the connector 120B and the circuit board structure 110. With above paths P1-P2, in some embodiments, the contact between the redistribution circuit structure 240 (e.g., the metallization pattern 244B of the coarse-featured portion 240B) and one or more than one connector 260 (e.g., 260A-260H) is tested to see whether there is a sufficient contact therebetween for rendering a proper electrical connection. The testing may be performed more than one time via the path P1, the path P2, a combination thereof, or the like, to confirm that the all of the connectors 260 do have sufficient contact with the redistribution circuit structure 240.

Figure 9:
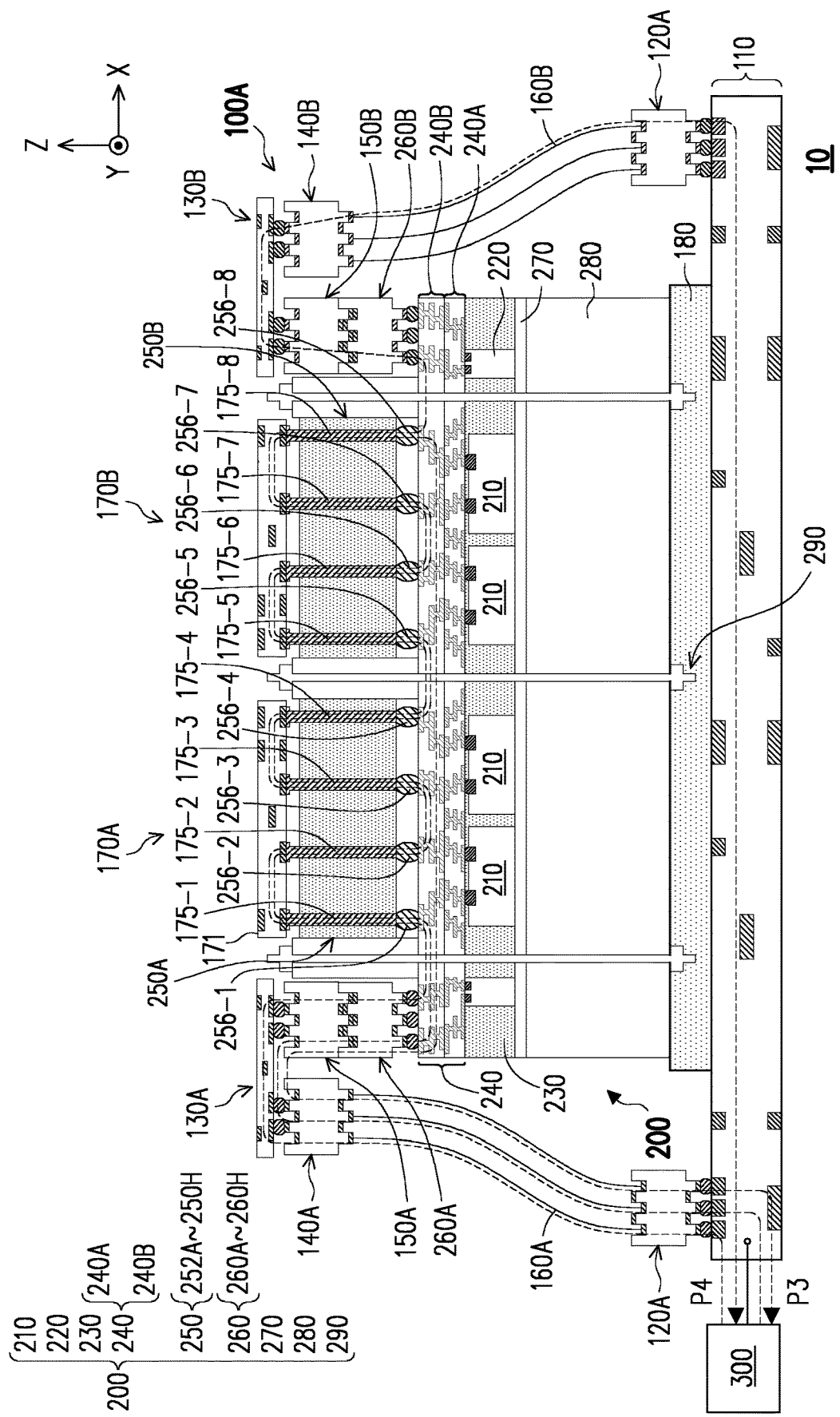
FIG. 9 is a schematic view showing possible testing electrical transmitting paths in accordance with some embodiments of the disclosure.

In some embodiment, the assembly 10 depicted in FIG. 6A (including the testing module 100A electrically connected to the controller 300 and the semiconductor wafer-form package 200) is illustrated in FIG. 9 to demonstrate the testing electrical transmitting paths P3 and P4 which are employed for testing whether there is a sufficient contact between the sockets 250 (e.g., the conductive connectors 256) and the redistribution circuit structure 240 (e.g., the metallization pattern 244B of the coarse-featured portion 240B) of the semiconductor wafer-form package 200 to render proper electrical connection therebetween. For one example, as shown in FIG. 9, via the testing electrical transmitting path P3, an electric signal (e.g., IS) is sent from the controller 300 to the semiconductor wafer-form package 200 by way of the circuit board structure 110, the connector 120A, the connecting structure 160A, the connector 140A, the connecting structure 130A, the connector 150A, the connector 260A, the coarse-featured portion 240B along with the socket 250A and the circuit board structure 170A (in a repeating manner, such as at least passing through the metallization pattern 244B, a conductive connector 256-1, a pin 175-1, the substrate 171, a pin 175-2, a conductive connector 256-2, the metallization pattern 244B, . . . , a conductive connector 256-4, a pin 175-4, a conductive connector 256-4), the coarse-featured portion 240B along with the socket 250B and the circuit board structure 170B (in a repeating manner, such as at least passing through the metallization pattern 244B, a conductive connector 256-5, a pin 175-5, the substrate 171, a pin 175-6, a conductive connector 256-6, the metallization pattern 244B, . . . , a conductive connector 256-8, a pin 175-8, a conductive connector 256-8) and the coarse-featured portion 240B; and the electric signal (e.g., OS) is sent from the semiconductor wafer-form package 200 to the controller 300 by way of the above components in the reversed order. If the sockets 250A and/or 250B is not making sufficient contact with the coarse-featured portion 240B of the redistribution circuit structure 240 to provide electrical coupling, then the electric signal attempting to traverse the above-described path would not be able to reach to the controller 300 via the testing module 100A. If, on the other hand, the electric signal does reach to the semiconductor wafer-form package 200 and return to the controller 300, then it may be concluded that the sufficient contact between the sockets 250A, 250B and the coarse-featured portion 240B of the redistribution circuit structure 240 is rendered.

Continued on FIG. 9, for another example, via the testing electrical transmitting path P4, an electric signal (e.g., IS) is sent from the controller 300 to the semiconductor wafer-form package 200 by way of the circuit board structure 110, the connector 120A, the connecting structure 160A, the connector 140A, the connecting structure 130A, the connector 150A, the connector 260A, the coarse-featured portion 240B along with the socket 250A and the circuit board structure 170A (in a repeating manner, such as at least passing through the metallization pattern 244B, a conductive connector 256-1, a pin 175-1, the substrate 171, a pin 175-2, a conductive connector 256-2, the metallization pattern 244B, . . . , a conductive connector 256-4, a pin 175-4, a conductive connector 256-4), the coarse-featured portion 240B along with the socket 250B and the circuit board structure 170B (in a repeating manner, such as at least passing through the metallization pattern 244B, a conductive connector 256-5, a pin 175-5, the substrate 171, a pin 175-6, a conductive connector 256-6, the metallization pattern 244B, . . . , a conductive connector 256-8, a pin 175-8, a conductive connector 256-8) and the coarse-featured portion 240B; and the electric signal (e.g., OS) is sent from the semiconductor wafer-form package 200 to the controller 300 by way of the coarse-featured portion 240B of the redistribution circuit structure 240, the connector 260B, the connector 150B, the connecting structure 130B, the connector 140B, the connecting structure 160B, the connector 120B and the circuit board structure 110. With above paths P3-P4, in some embodiments, the contact between the redistribution circuit structure 240 (e.g., the metallization pattern 244B of the coarse-featured portion 240B) and one or more than one socket 250 (e.g., 260A-260H) is tested to see whether there is a sufficient contact therebetween for rendering a proper electrical connection. The testing may be performed more than one time via the path P3, the path P4, a combination thereof, or the like, to confirm that the all of the sockets 250 do have sufficient contact with the redistribution circuit structure 240.

Figure 10A:
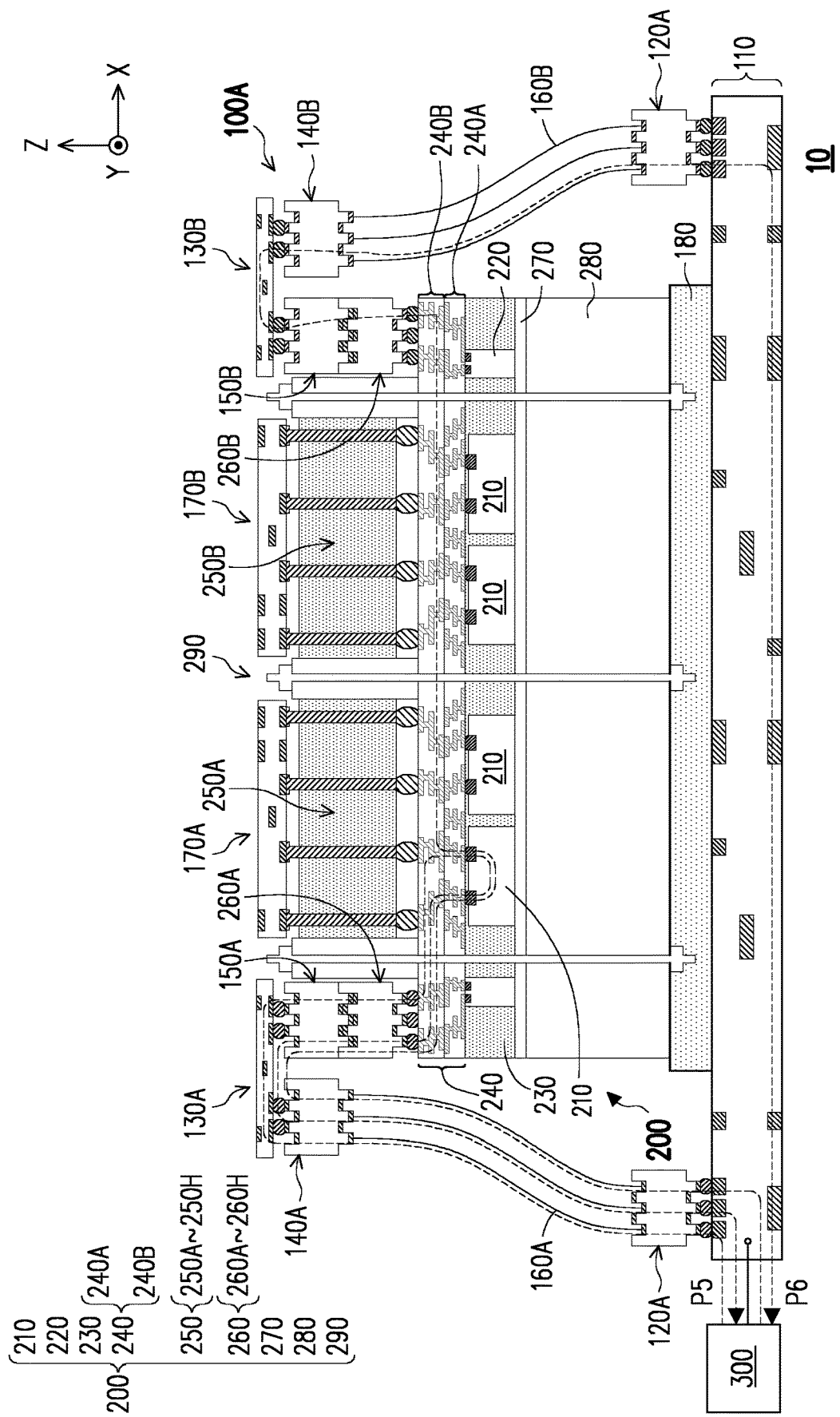
FIG. 10A and FIG. 10B are schematic views independently showing possible testing electrical transmitting paths in accordance with some embodiments of the disclosure.

In some embodiments, the assembly 10 depicted in FIG. 6A (including the testing module 100A electrically connected to the controller 300 and the semiconductor wafer-form package 200) is illustrated in FIG. 10A to demonstrate the testing electrical transmitting paths P5 and P6 which are employed for testing whether there is a sufficient contact between the semiconductor dies 210 (e.g., the conductive vias 212) and the redistribution circuit structure 240 (e.g., the metallization pattern 244A of the fine-featured portion 240A) of the semiconductor wafer-form package 200 to render proper electrical connection therebetween. For one example, as shown in FIG. 10A, via the testing electrical transmitting path P5, an electric signal (e.g., IS) is sent from the controller 300 to the semiconductor wafer-form package 200 by way of the circuit board structure 110, the connector 120A, the connecting structure 160A, the connector 140A, the connecting structure 130A, the connector 150A, the connector 260A, the coarse-featured portion 240B, the fine-featured portion 240A and one semiconductor die 210 (such as the leftmost semiconductor die 210 shown in FIG. 10A); and the electric signal (e.g., OS) is sent from the semiconductor wafer-form package 200 to the controller 300 by way of the above components in the reversed order. If the leftmost semiconductor die 210 is not making sufficient contact with the fine-featured portion 240A of the redistribution circuit structure 240 to provide electrical coupling, then the electric signal attempting to traverse the above-described path would not be able to return to the controller 300 via the testing module 100A. If, on the other hand, the electric signal does reach to the semiconductor wafer-form package 200 and return to the controller 300, then it may be concluded that the sufficient contact between the leftmost semiconductor die 210 and the fine-featured portion 240A of the redistribution circuit structure 240 is rendered.

Continued on FIG. 10A, for another example, via the testing electrical transmitting path P6, an electric signal (e.g., IS) is sent from the controller 300 to the semiconductor wafer-form package 200 by way of the circuit board structure 110, the connector 120A, the connecting structure 160A, the connector 140A, the connecting structure 130A, the connector 150A, the connector 260A, the coarse-featured portion 240B, the fine-featured portion 240A and one semiconductor die 210 (such as the leftmost semiconductor die 210 shown in FIG. 10A); and the electric signal (e.g., OS) is sent from the semiconductor wafer-form package 200 to the controller 300 by way of the semiconductor die 210 (such as the leftmost semiconductor die 210 shown in FIG. 10A), the fine-featured portion 240A, the coarse-featured portion 240B, the connector 260B, the connector 150B, the connecting structure 130B, the connector 140B, the connecting structure 160B, the connector 120B and the circuit board structure 110.

Figure 10B:
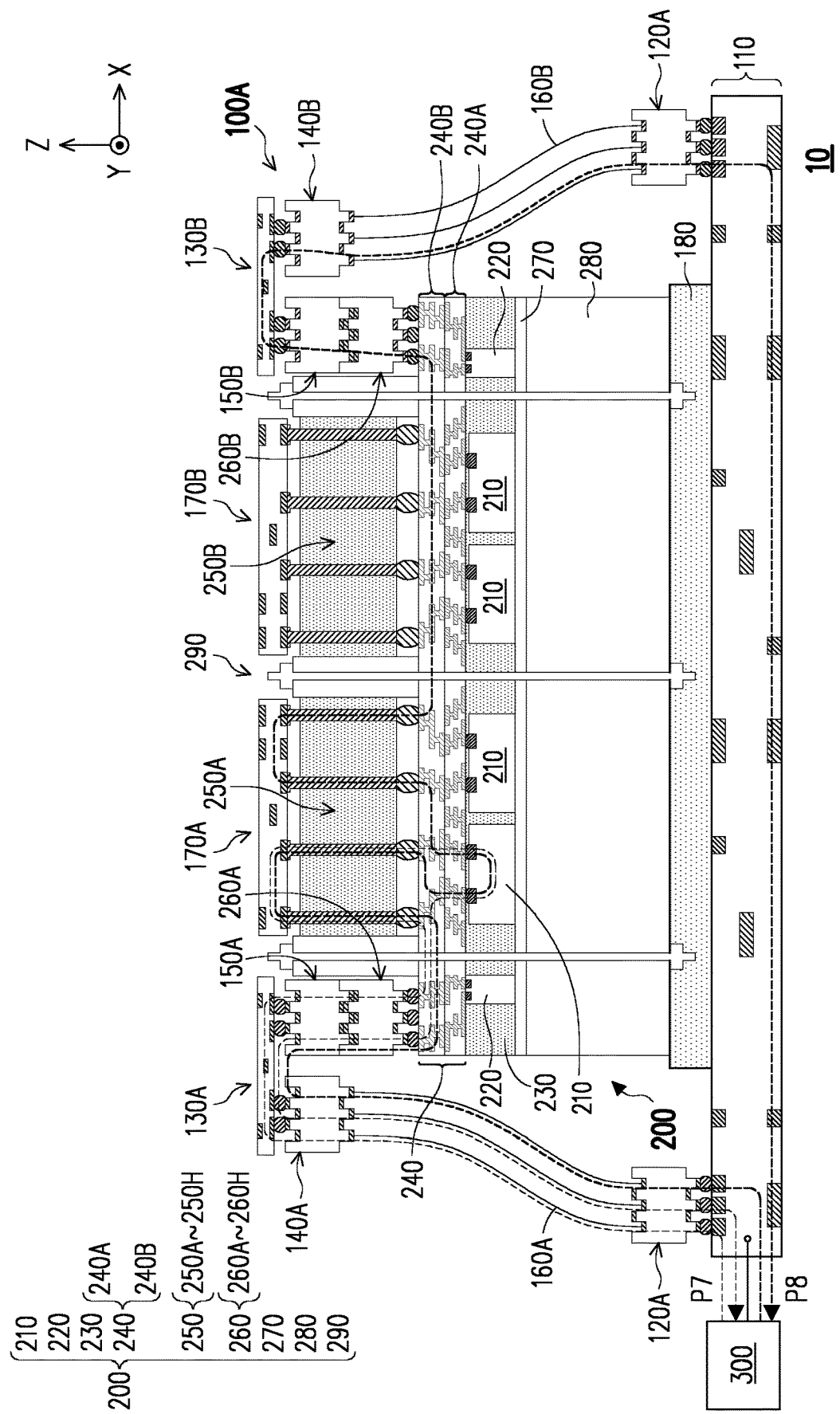

In alternative embodiments, the assembly 10 depicted in FIG. 6A (including the testing module 100A electrically connected to the controller 300 and the semiconductor wafer-form package 200) is illustrated in FIG. 10B to demonstrate the testing electrical transmitting paths P7 and P8 which are also employed for testing whether there is a sufficient contact between the semiconductor dies 210 (e.g., the conductive vias 212) and the redistribution circuit structure 240 (e.g., the metallization pattern 244A of the fine-featured portion 240A) of the semiconductor wafer-form package 200 to render proper electrical connection therebetween. For example, the testing electrical transmitting path P7 depicted in FIG. 10B is similar to the testing electrical transmitting path P5 depicted in FIG. 10A, and the testing electrical transmitting path P8 depicted in FIG. 10B is similar to the testing electrical transmitting path P6 depicted in FIG. 10A, where the differences are that, the testing electrical transmitting paths P7 and P8 depicted in FIG. 10B independently further include at least one of the sockets 250 and at least one of the circuit board structures 170.

For one example, as shown in FIG. 10B, via the testing electrical transmitting path P7, an electric signal (e.g., IS) is sent from the controller 300 to the semiconductor wafer-form package 200 by way of the circuit board structure 110, the connector 120A, the connecting structure 160A, the connector 140A, the connecting structure 130A, the connector 150A, the connector 260A, the coarse-featured portion 240B along with the socket 250A and the circuit board structure 170A (in a manner such as at least passing through the metallization pattern 244B, a conductive connector 256-1, a pin 175-1, the substrate 171, a pin 175-2, a conductive connector 256-2, the metallization pattern 244B), the fine-featured portion 240A, and one semiconductor die 210 (such as the leftmost semiconductor die 210 shown in FIG. 10B); and the electric signal (e.g., OS) is sent from the semiconductor wafer-form package 200 to the controller 300 by way of the leftmost semiconductor die 210 (as shown in FIG. 10B), the fine-featured portion 240A, the coarse-featured portion 240B, the connector 260A, the connector 150A, the connecting structure 130A, the connector 120A, the connecting structure 160A, the connector 120A and the circuit board structure 110.

Continued on FIG. 10B, for another example, via the testing electrical transmitting path P8, an electric signal (e.g., IS) is sent from the controller 300 to the semiconductor wafer-form package 200 by way of the circuit board structure 110, the connector 120A, the connecting structure 160A, the connector 140A, the connecting structure 130A, the connector 150A, the connector 260A, the coarse-featured portion 240B along with the socket 250A and the circuit board structure 170A (in a repeating manner, such as at least passing through the metallization pattern 244B, a conductive connector 256-1, a pin 175-1, the substrate 171, a pin 175-2, a conductive connector 256-2, the metallization pattern 244B), the fine-featured portion 240A and one semiconductor die 210 (such as the leftmost semiconductor die 210 shown in FIG. 10B); and the electric signal (e.g., OS) is sent from the semiconductor wafer-form package 200 to the controller 300 by way of the leftmost semiconductor die 210, the fine-featured portion 240A, the coarse-featured portion 240B along with the socket 250A and the circuit board structure 170A (in a repeating manner, such as at least passing through the metallization pattern 244B, a conductive connector 256-3, a pin 175-3, the substrate 171, a pin 175-4, a conductive connector 256-4, the metallization pattern 244B), the connector 260B, the connector 150B, the connecting structure 130B, the connector 140B, the connecting structure 160B, the connector 120B and the circuit board structure 110.

With above paths P5-P8, in some embodiments, the contact between the redistribution circuit structure 240 (e.g., the metallization pattern 244A of the fine-featured portion 240A) and one or more than one semiconductor die 210 is tested to see whether there is a sufficient contact therebetween for rendering a proper electrical connection. The testing may be performed more than one time via the path P5, the path P6, the path P7, the path P8, a combination thereof, or the like, to confirm that the all of the semiconductor dies 210 do have sufficient contact with the redistribution circuit structure 240. In addition, the I/O interface dies 220 may also be tested in the way similar to or the same as the way used to test the semiconductor dies 210.

Figure 11A:
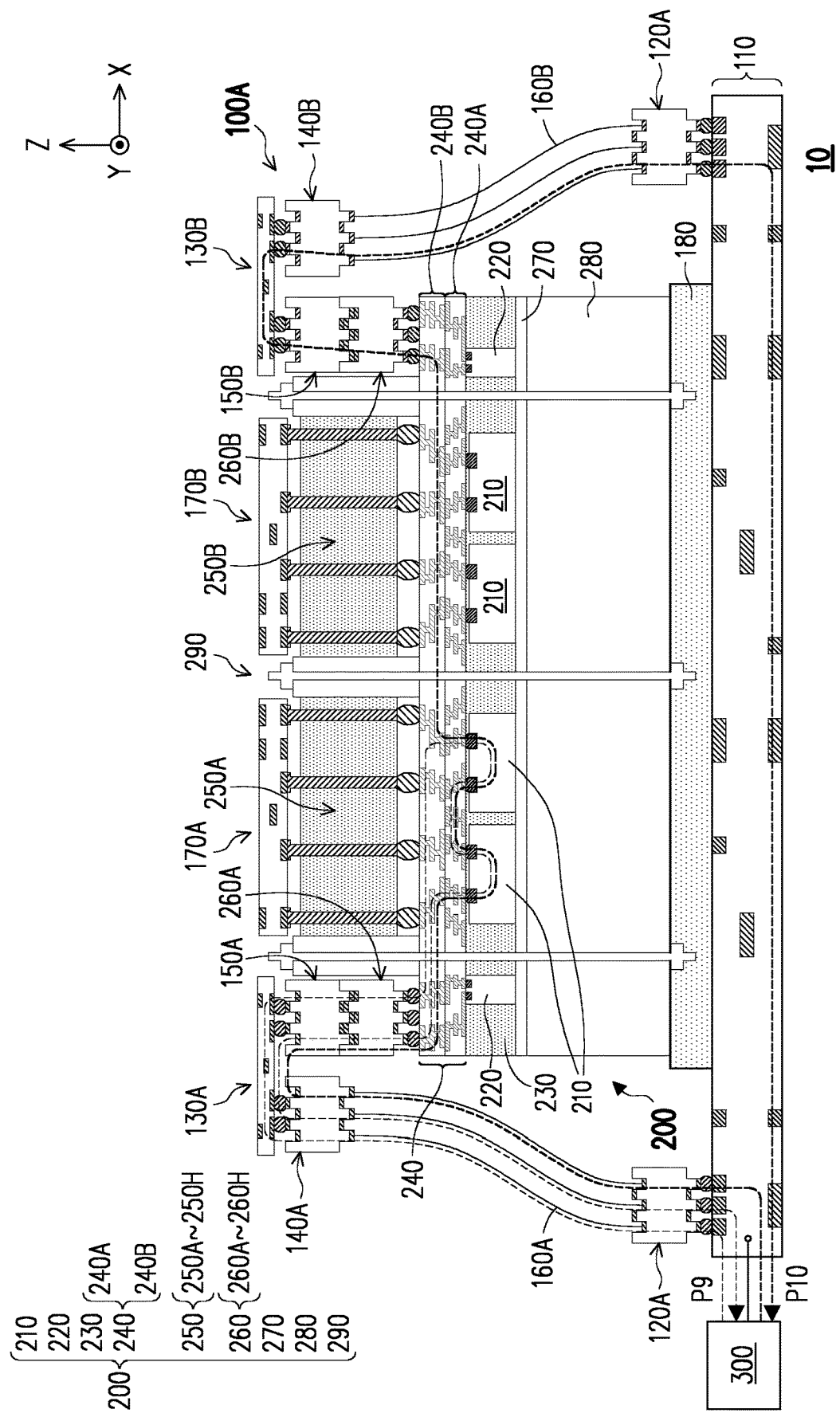
FIG. 11A and FIG. 11B are schematic views independently showing possible testing electrical transmitting paths in accordance with some embodiments of the disclosure.

In some embodiments, the assembly 10 depicted in FIG. 6A (including the testing module 100A electrically connected to the controller 300 and the semiconductor wafer-form package 200) is illustrated in FIG. 11A to demonstrate the testing electrical transmitting paths P9 and P10 which are employed for testing whether there is an sufficient contact (e.g., an interconnect) between two semiconductor dies 210 via the redistribution circuit structure 240 (e.g., the metallization pattern 244A of the fine-featured portion 240A) of the semiconductor wafer-form package 200 to render proper electrical connection (e.g., electrical communication) therebetween. For one example, as shown in FIG. 11A, via the testing electrical transmitting path P9, an electric signal (e.g., IS) is sent from the controller 300 to the semiconductor wafer-form package 200 by way of the circuit board structure 110, the connector 120A, the connecting structure 160A, the connector 140A, the connecting structure 130A, the connector 150A, the connector 260A, the coarse-featured portion 240B, the fine-featured portion 240A, one semiconductor die 210 (such as the leftmost semiconductor die 210 shown in FIG. 11A), the fine-featured portion 140A and another semiconductor die 210 (such as the second semiconductor die 210 from the left shown in FIG. 11A); and the electric signal (e.g., OS) is sent from the semiconductor wafer-form package 200 to the controller 300 by way of the another semiconductor die 210, the fine-featured portion 240A, the coarse-featured portion 240B, the connector 260A, the connector 150A, the connecting structure 130A, the connector 140A, the connecting structure 160A, the connector 120A and the circuit board structure 110. If the interconnect between these two semiconductor dies 210 is not sufficient to provide electrical coupling, then the electric signal attempting to traverse the above-described path would not be able to return to the controller 300 via the testing module 100A. If, on the other hand, the electric signal does reach to the semiconductor wafer-form package 200 and return to the controller 300, then it may be concluded that the sufficient contact between the semiconductor dies 210 is rendered. In other words, the effective interconnect between these two semiconductor dies 210 is confirmed.

Continued on FIG. 11A, for another example, via the testing electrical transmitting path P10, an electric signal (e.g., IS) is sent from the controller 300 to the semiconductor wafer-form package 200 by way of the circuit board structure 110, the connector 120A, the connecting structure 160A, the connector 140A, the connecting structure 130A, the connector 150A, the connector 260A, the coarse-featured portion 240B, the fine-featured portion 240A, one semiconductor die 210 (such as the leftmost semiconductor die 210 shown in FIG. 11A), the fine-featured portion 140A, and another semiconductor die 210 (such as the second semiconductor die 210 from the left shown in FIG. 11A); and the electric signal (e.g., OS) is sent from the semiconductor wafer-form package 200 to the controller 300 by way of the another semiconductor die 210, the fine-featured portion 240A, the coarse-featured portion 240B, the connector 260B, the connector 150B, the connecting structure 130B, the connector 140B, the connecting structure 160B, the connector 120B and the circuit board structure 110.

Figure 11B:
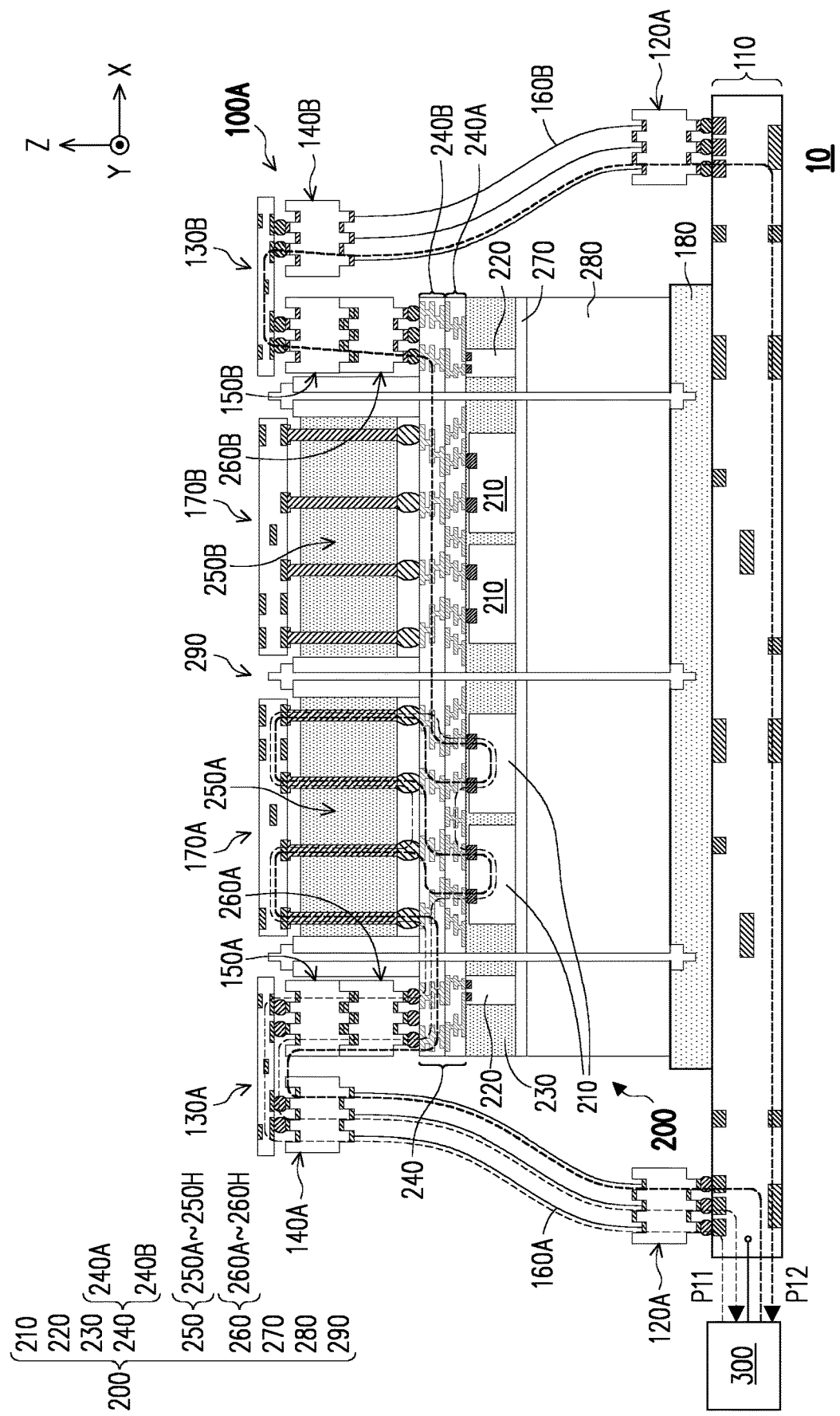

In alternative embodiments, the assembly 10 depicted in FIG. 6A (including the testing module 100A electrically connected to the controller 300 and the semiconductor wafer-form package 200) is illustrated in FIG. 11B to demonstrate the testing electrical transmitting paths P11 and P12 which are also employed for testing whether there is a sufficient contact (e.g., the effective interconnect), via the redistribution circuit structure 240, between two semiconductor dies 210 of the semiconductor wafer-form package 200 to render proper electrical connection therebetween. For example, the testing electrical transmitting path P11 depicted in FIG. 11B is similar to the testing electrical transmitting path P9 depicted in FIG. 11A, and the testing electrical transmitting path P12 depicted in FIG. 11B is similar to the testing electrical transmitting path P10 depicted in FIG. 11A, where the differences are that, the testing electrical transmitting paths P11 and P12 depicted in FIG. 11B independently further include at least one of the sockets 250 and at least one of the circuit board structures 170.

For one example, as shown in FIG. 11B, via the testing electrical transmitting path P11, an electric signal (e.g., IS) is sent from the controller 300 to the semiconductor wafer-form package 200 by way of the circuit board structure 110, the connector 120A, the connecting structure 160A, the connector 140A, the connecting structure 130A, the connector 150A, the connector 260A, the coarse-featured portion 240B along with the socket 250A and the circuit board structure 170A (in a manner such as at least passing through the metallization pattern 244B, a conductive connector 256-1, a pin 175-1, the substrate 171, a pin 175-2, a conductive connector 256-2, the metallization pattern 244B), the fine-featured portion 240A, one semiconductor die 210 (such as the leftmost semiconductor die 210 shown in FIG. 10B), the fine-featured portion 240A, the coarse-featured portion 240B along with the socket 250A and the circuit board structure 170A (in a manner such as at least passing through the metallization pattern 244B, a conductive connector 256-3, a pin 175-3, the substrate 171, a pin 175-4, a conductive connector 256-4, the metallization pattern 244B), the fine-featured portion 240A and another semiconductor die 210 (e.g., the second semiconductor die 210 from the left as shown in FIG. 11B); and the electric signal (e.g., OS) is sent from the semiconductor wafer-form package 200 to the controller 300 by way of the another semiconductor die 210, the fine-featured portion 240A, the coarse-featured portion 240B, the connector 260A, the connector 150A, the connecting structure 130A, the connector 120A, the connecting structure 160A, the connector 120A and the circuit board structure 110.

Continued on FIG. 11B, for another example, via the testing electrical transmitting path P8, an electric signal (e.g., IS) is sent from the controller 300 to the semiconductor wafer-form package 200 by way of the circuit board structure 110, the connector 120A, the connecting structure 160A, the connector 140A, the connecting structure 130A, the connector 150A, the connector 260A, the coarse-featured portion 240B along with the socket 250A and the circuit board structure 170A (in a manner such as at least passing through the metallization pattern 244B, a conductive connector 256-1, a pin 175-1, the substrate 171, a pin 175-2, a conductive connector 256-2, the metallization pattern 244B), the fine-featured portion 240A, one semiconductor die 210 (such as the leftmost semiconductor die 210 shown in FIG. 10B), the fine-featured portion 240A, the coarse-featured portion 240B along with the socket 250A and the circuit board structure 170A (in a manner such as at least passing through the metallization pattern 244B, a conductive connector 256-3, a pin 175-3, the substrate 171, a pin 175-4, a conductive connector 256-4, the metallization pattern 244B), the fine-featured portion 240A and another semiconductor die 210 (e.g., the second semiconductor die 210 from the left as shown in FIG. 11B); and the electric signal (e.g., OS) is sent from the semiconductor wafer-form package 200 to the controller 300 by way of the another semiconductor die 210, the fine-featured portion 240A, the coarse-featured portion 240B, the connector 260B, the connector 150B, the connecting structure 130B, the connector 140B, the connecting structure 160B, the connector 120B and the circuit board structure 110.

With above paths P9-P12, in some embodiments, the contact between two semiconductor die 210 via the redistribution circuit structure 240 is tested to see whether there is a sufficient contact (e.g., the effective interconnect) therebetween for rendering a proper electrical connection. The testing may be performed more than one time via the path P9, the path P10, the path P11, the path P12, a combination thereof, or the like, to confirm that at least a portion of the semiconductor dies 210 do have sufficient contact with each other through the redistribution circuit structure 240. Besides, an effective interconnect among the I/O interface dies 220 may also be tested in the way similar to or the same as the way used to test the semiconductor dies 210. Alternatively, an effective interconnect between one of the semiconductor dies 210 and one of I/O interface dies 220 may also be tested in the way similar to or the same as the way used to test the semiconductor dies 210.

Figure 12A:
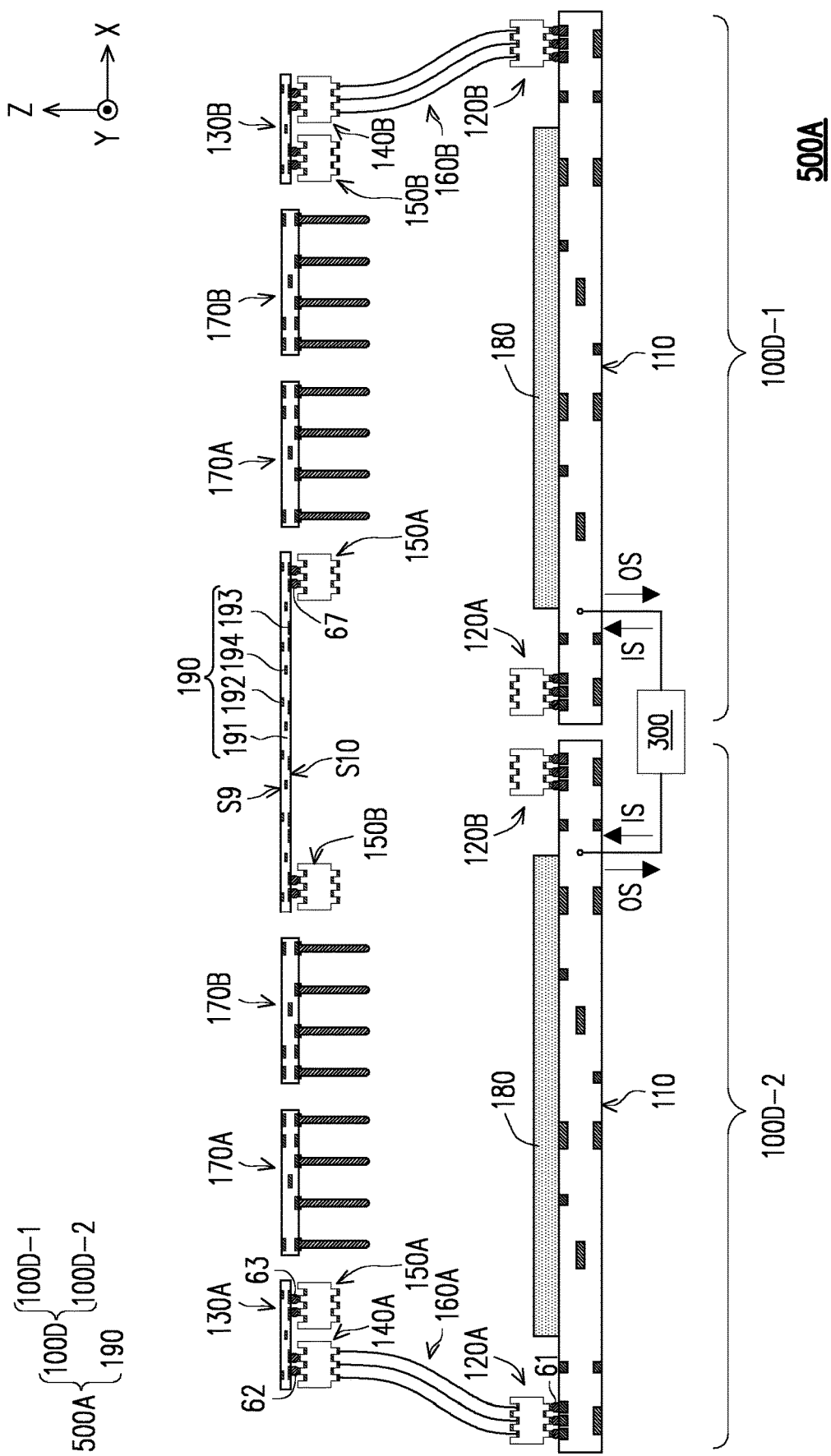
FIG. 12A is a schematic cross-sectional view of a testing system in accordance with some embodiments of the disclosure.
Figure 12B:
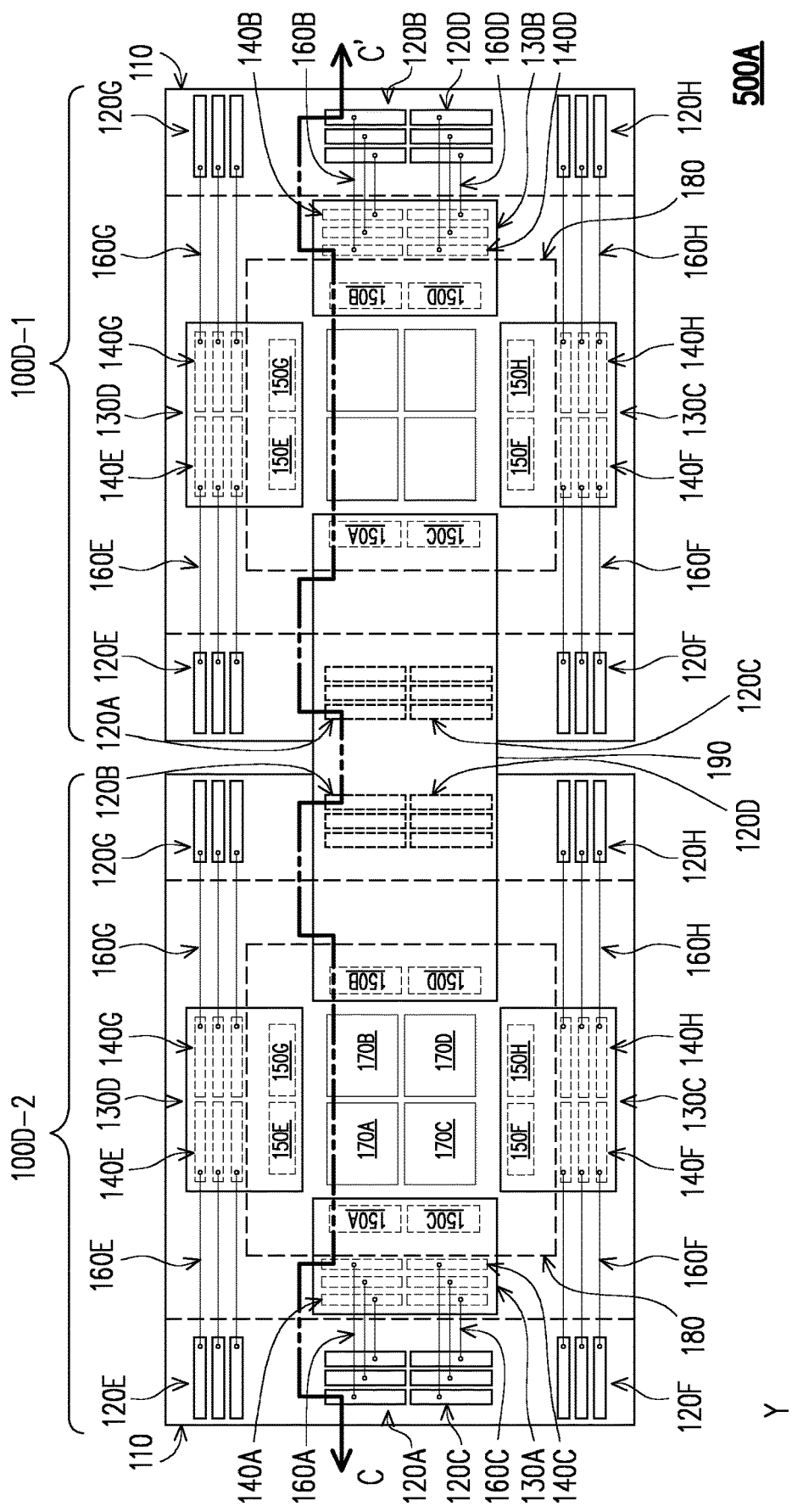
FIG. 12B is a top view illustrating the testing system depicted in FIG. 12A.
Figure 13:
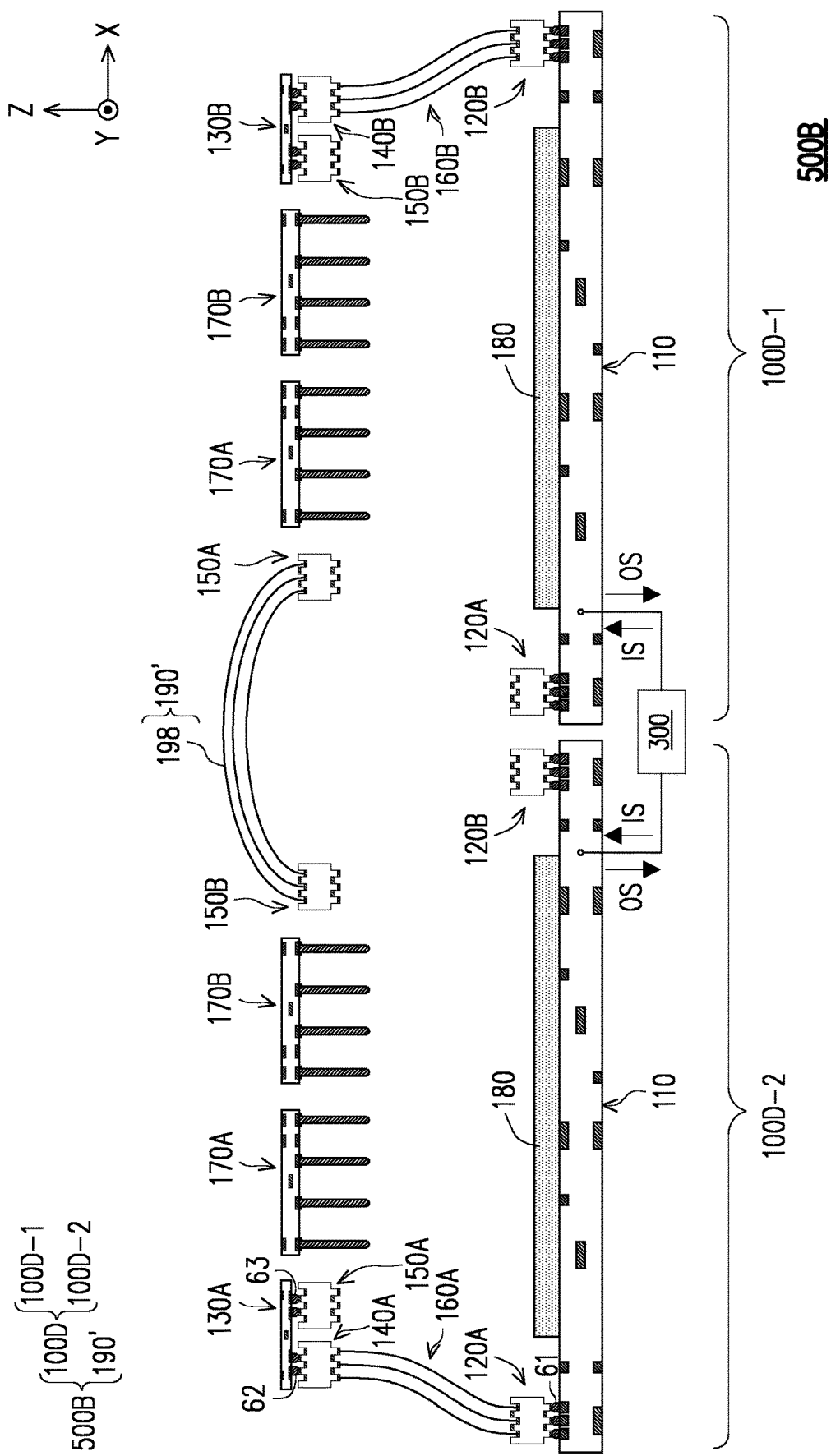
FIG. 13 is a schematic cross-sectional view of a testing system in accordance with some embodiments of the disclosure.

However, the disclosure is not limited thereto, where multiple semiconductor wafer-form packages 200 may be tested at one time. FIG. 12A and FIG. 12B respectively illustrate a schematic cross-sectional view and a top view of a testing system comprising more than one testing module and more than one semiconductor wafer-form package in accordance with some embodiments of the disclosure, where FIG. 12A is the cross-sectional view taken along a line CC' depicted in FIG. 12B. FIG. 13 is a schematic cross-sectional view of a testing system in accordance with some embodiments of the disclosure. The elements similar to or substantially the same as the elements described previously will use the same reference numbers, and certain details or descriptions (e.g. the materials, positioning configurations, electrical connection relationships, etc.) of the same elements would not be repeated herein.

Referring to FIG. 12A and FIG. 12B, in some embodiments, a testing system 500A include at least two testing modules 100D (e.g., "100D-1" which indicates a testing module 100D at the left and "100D-2" which indicates one testing module 100D at the right as shown in FIG. 12A and FIG. 12B) and a connecting structure 190 electrically connected to the testing modules 100D. It is appreciated that one testing module 100D is configurated for accommodating one semiconductor wafer-form package 200. In some embodiments, the testing modules 100D (e.g., 100D-1 and 100D-2) depicted in FIG. 12A and FIG. 12B are similar to the testing module 100A as described in FIG. 2A and FIG. 2B, the difference is that, for the testing modules 100D, at least one the connecting structure 130, connectors 140 located thereon and a respective connecting structure 160 are omitted; and thus, the details of the testing modules 100D are not repeated herein for simplicity.

In some embodiments, the connecting structure 190 extends from one of the testing modules 100D-1 and 100D-2 to other one of the testing modules 100D-1 and 100D-2 on the X-Y plane as shown in FIG. 12B, where the connectors 150 of the testing modules 100D-1 and 100D-2, which are free of the connecting structures 130, are located over one connecting structure 190. The positioning location of the connecting structure 190 may be partially overlapped with a positioning location of the testing module 100D-1 and a positioning location of the testing module 100D-2 along the direction Z. For example, as shown in FIG. 12B, the connecting structure 190 is located over and overlapped with the periphery region 101p and the edge region 102 of the testing modules 100D-1 and 100D-2.

In some embodiments, as shown in FIG. 12A, the connecting structure 190 includes a substrate 191, a plurality of contact pads 192, a plurality of contact pads 193, and an internal circuitry 194 including metallization layers and vias (not shown) interconnected. For example, the contact pads 192 and the contact pads 193 are respectively distributed on two opposite sides of the substrate 191, and are exposed for electrically connecting with other elements/features. The contact pads 192 may be distributed over the surface S9 of the substrate 191, while the contact pads 193 may be distributed over the surface S10 of the substrate 191; or, vice versa. The surface S9 and surface S10 are opposite to each other along the direction Z, for example, as shown in FIG. 12A. In some embodiments, the internal circuitry 194 (including the metallization layers and the vias) is embedded in the substrate 191 and provides a routing function for the substrate 191, where the metallization layers and the vias included in the internal circuitry 194 are electrically connected to the contact pads 192 and the contact pads 193. That is, the contact pads 192 are electrically coupled to the contact pads 193 through the internal circuitry 194, for example. On the other hand, in some embodiments, one of the contact pads 192 is also electrically coupled to another contact pad 192 through the internal circuitry 194, and/or one of the contact pads 193 is also electrically coupled to another contact pad 193 through the internal circuitry 194. For example, as shown in FIG. 12A, the testing module 100D-1 and the testing module 100D-2 are electrically coupled through electrically connecting the contact pads 193 of the connecting structure 190 to the connector 150B of the testing module 100D-2 and to the connector 150A of the testing module 100D-1 via conductive connectors 67. The material and formation of the conductive connectors 67 may be the same as or similar to the material and formation of the conductive connectors 61 as described above; and thus, are not repeated herein. However, the disclosure is not limited thereto; in alternative embodiments (not shown), any two or more than two adjacent conductive connectors 67 may be connected to each other through at least one additional conductive connector in the way similar to the method of which applied on the conductive connectors 61-63.

The material and formation of the substrate 191 may be the same as or similar to the material and formation of the substrate 111, the material and formation of the contact pads 192 and the material and formation of the contact pads 193 may be the same as or similar to the material and formation of the contact pads 112 and/or 113, and the material and formation of the internal circuitry 194 may be the same as or similar to the material and formation of the internal circuitry 114; and thus are omitted herein. For example, as shown in the top view of FIG. 12B, the shape of the connecting structure 190 is a rectangular shape, however the disclosure is not limited thereto. The shape of the connecting structure 190 may be a circular, oral, ellipse, square, or any suitable polygonal shape.

In some embodiments, the connecting structure 190 is electrically coupled to the circuit board structure 110 of the testing module 100D-1 through at least the connectors 150A, one object to-be-tested (e.g., 200-1 similar to the semiconductor wafer-form package 200 described in FIG. 6A), the connectors 150B, the connecting structure 130B, the connectors 140B, the connecting structure 160B and the connectors 120B. In some embodiments, the connecting structure 190 is electrically coupled to the circuit board structure 110 of the testing module 100D-2 through at least the connectors 150B, other one object to-be-tested (e.g., 200-2 similar to the semiconductor wafer-form package 200 described in FIG. 6A), the connectors 150A, the connecting structure 130A, the connectors 140A, the connecting structure 160A and the connectors 120A. In certain embodiments, for the testing system 500A, the circuit board structure 110 of the testing module 100D-1 are electrically connected to a controller (e.g., the controller 300 described in FIG. 2A and FIG. 6A), where the controller 300 is further electrically connected to the circuit board structure 110 of the testing module 100D-1.

As shown in the testing system 500A of FIG. 12A, in certain embodiments, the connecting structure 190 includes an organic flexible substrate or a printed circuit board connected to the controller 300. However, the disclosure is not limited thereto, and the connecting structure 190 may be substituted by a connecting structure 190'. In an alternative embodiment of a testing system 500B shown in FIG. 13, the connecting structure 190 is substituted by the connecting structure 190'. For example, the connecting structure 190' includes a plurality of conductive wire 198, such as parallel conductive wires, electrically connecting the corresponding connectors 150 (e.g., the connector 150B of the testing module 100D-2 and the connector 150A of the testing module 100D-1). The material and structure of the connecting structure 190' (e.g., the conductive wires 198) may be the same as or similar to the material and structure of the connecting structures 160, and thus are not repeating therein for brevity.

Figure 14A:
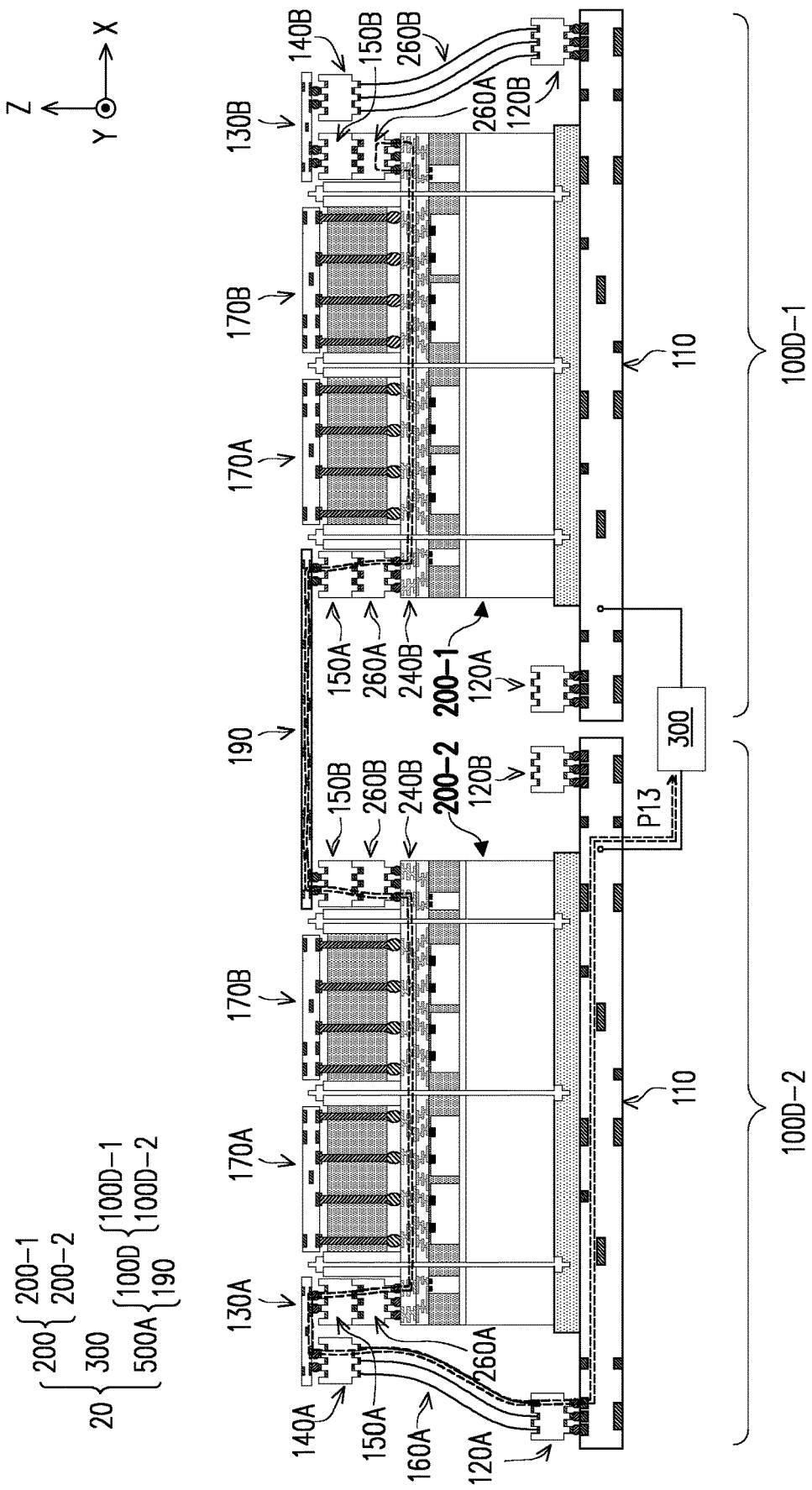
FIG. 14A and FIG. 14B are schematic views independently showing possible testing electrical transmitting paths in an assembly of a testing system and semiconductor wafer-form packages in accordance with some embodiments of the disclosure.
Figure 14B:
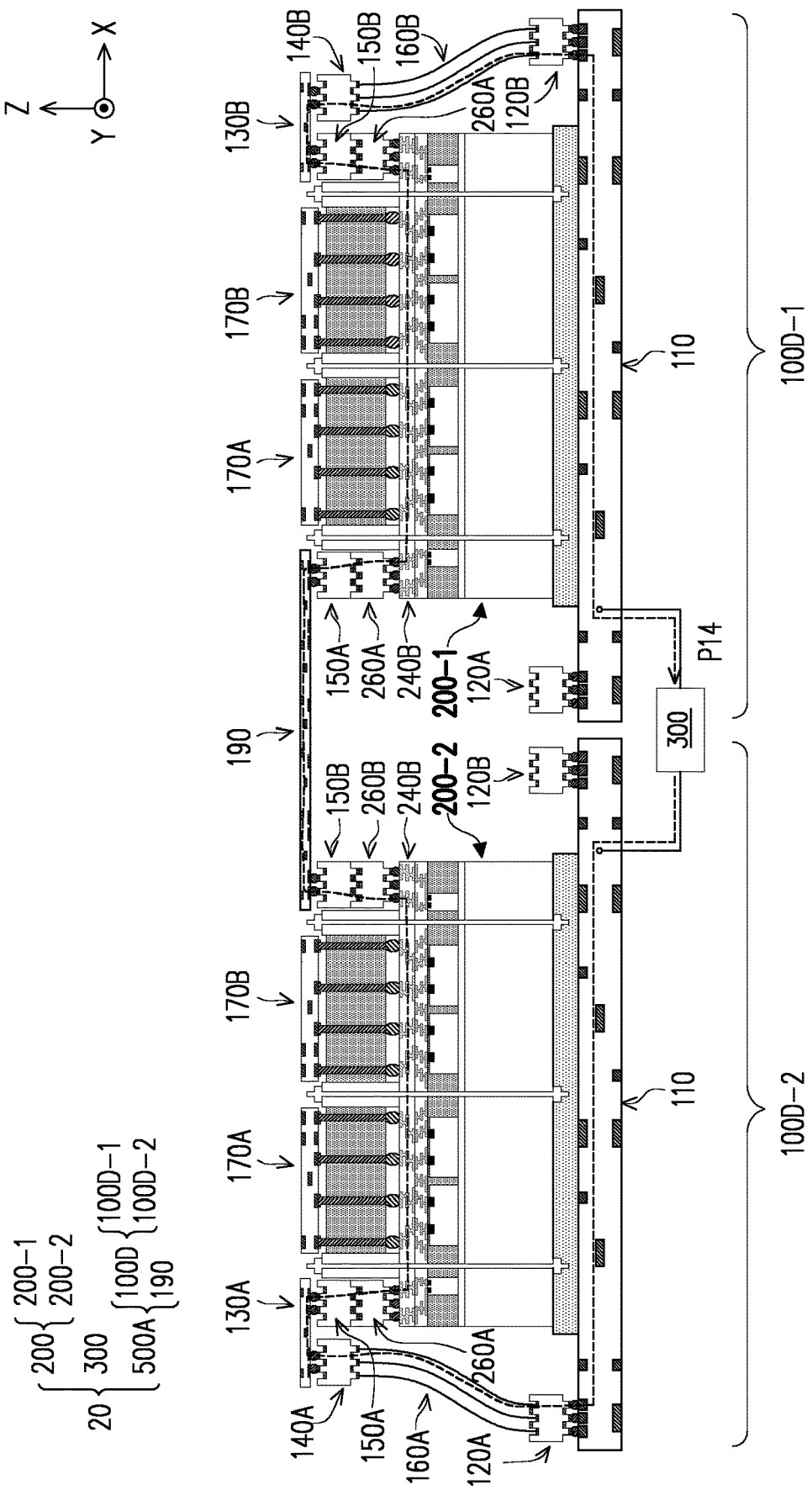

Similar to assembly 10, in the testing method using the testing system 500A, an assembly 20 may have several possible testing electrical transmitting paths to test multiple semiconductor wafer-form packages 200-1 and 200-2, at one time. For example, two possible testing electrical transmitting paths P13 and P14 are respectively shown in FIG. 14A and FIG. 14B for illustrative purposes, however the disclosure is not limited herein. More possible testing electrical transmitting paths, which may further have similar routing paths to the testing electrical transmitting path P1-P12, may be employed in the assembly 20. FIG. 14A and FIG. 14B are schematic view showing possible testing electrical transmitting paths existing in an assembly of the testing system 500A depicted in FIG. 12A and the semiconductor wafer-form packages 200-1 and 200-2. The elements similar to or substantially the same as the elements described previously will use the same reference numbers, and certain details or descriptions (e.g. the materials, positioning configurations, electrical connection relationships, etc.) of the same elements would not be repeated herein.

For example, as shown in FIG. 14A and FIG. 14B, the assembly 20 includes the testing system 500A depicted in FIG. 12A, the controller 300 electrically connected to the testing system 500A, and the semiconductor wafer-form packages 200 (e.g., 200-1 and 200-2), where the two semiconductor wafer packages 200 (e.g., 200-1 and 200-2) are respectively installed in and electrically coupled to the testing modules 100D (e.g., 100D-1 and 100D-2) included in the testing system 500A. In some embodiments, the assembly 20 illustrated in FIG. 14A and FIG. 14B respectively demonstrates the testing electrical transmitting paths P13 and P14 which are employed for testing whether there is a sufficient contact between the connectors 260 (e.g., the contacts 262, 263 included in the connectors 260A through 260H) and the redistribution circuit structure 240 (e.g., the metallization pattern 244B of the coarse-featured portion 240B) respectively inside the semiconductor wafer-form packages 200-1 and 200-2 to render proper electrical connection therebetween.

For one example, as shown in FIG. 14A, via the testing electrical transmitting path P13, an electric signal (e.g., IS) is sent from the controller 300 to the semiconductor wafer-form package 200-2 and then to the semiconductor wafer-form package 200-1, by way of the testing module 100D-2 (involving the circuit board structure 110, the connector 120A, the connecting structure 160A, the connector 140A, the connecting structure 130A and the connector 150A), the semiconductor wafer-form package 200-2 (involving the connector 260A, the coarse-featured portion 240B of the redistribution circuit structure 240 and the connectors 260B), the testing module 100D-2 (involving the connectors 150B), the connecting structure 190, the testing module 100D-1 (involving the connectors 150A), the semiconductor wafer-form package 200-1 (involving the connectors 260A, the coarse-featured portion 240B of the redistribution circuit structure 240 and the connectors 260B); and the electric signal (e.g., OS) is sent from the semiconductor wafer-form package 200-1 to the controller 300 by way of the above components in the reversed order. If the connectors 260 included in the semiconductor wafer-form packages 200-1 and 200-2 are not making sufficient contact with the coarse-featured portion 240B of a respective one redistribution circuit structure 240 to provide electrical coupling, then the electric signal attempting to traverse the above-described path would not be able to reach to the semiconductor wafer-form packages 200 correspondingly. If, on the other hand, the electric signal does reach to the semiconductor wafer-form packages 200 and return to the controller 300, then it may be concluded that the sufficient contact between the connectors 260 and the coarse-featured portion 240B of the respective one redistribution circuit structure 240 is rendered.

Continued on FIG. 14B, for another example, via the testing electrical transmitting path P14, an electric signal (e.g., IS) is sent from the controller 300 to the semiconductor wafer-form package 200-2 and then to the semiconductor wafer-form package 200-1, by way of the testing module 100D-2 (involving the circuit board structure 110, the connector 120A, the connecting structure 160A, the connector 140A, the connecting structure 130A and the connector 150A), the semiconductor wafer-form package 200-2 (involving the connector 260A, the coarse-featured portion 240B of the redistribution circuit structure 240 and the connectors 260B), the testing module 100D-2 (involving the connectors 150B), the connecting structure 190, the testing module 100D-1 (involving the connectors 150A), the semiconductor wafer-form package 200-1 (involving the connectors 260A, the coarse-featured portion 240B of the redistribution circuit structure 240 and the connectors 260B); and the electric signal (e.g., OS) is sent from the semiconductor wafer-form package 200-1 to the controller 300 by way of the testing module 100D-1 (involving the connectors 150B, the circuit board structure 130B, the connectors 140B, the connecting structure 160B, the connectors 120B and the circuit board structure 110). With above paths P13-P14, in some embodiments, the contact between the redistribution circuit structure 240 (e.g., the metallization pattern 244B of the coarse-featured portion 240B) and one or more than one connector 260 (e.g., 260A-260H) respectively included in the independent and individual semiconductor wafer-form packages 200 are tested to see whether there is a sufficient contact therebetween for rendering a proper electrical connection. The testing may be performed more than one time via the path P13, the path P14, a combination thereof, or the like, to confirm that the all of the connectors 260 do have sufficient contact with the respective redistribution circuit structure 240.

In some embodiments, besides testing an electrical connection between the connectors (e.g., 260) and the redistribution circuit structure 240 independently in the semiconductor wafer-form packages 200-1 and 200-2 (as described in FIG. 14A and FIG. 14B), the assembly 20 has other possible testing electrical transmitting paths (not shown) similar to the testing electrical transmitting paths P3 through P12 introduced to the assembly 10 for testing multiple semiconductor wafer-form packages, at one time, via the testing system 500A (or via the testing system 500B). For example, such possible testing electrical transmitting paths are employed for testing an electrical connection between the sockets (e.g., 250) and the redistribution circuit structure (e.g., 240) independently in the semiconductor wafer-form packages 200-1 and 200-2; testing an electrical connection between one of the dies (e.g., 210 or 220) and the redistribution circuit structure (e.g., 240) independently in the semiconductor wafer-form packages 200-1 and 200-2; and testing an electrical connection between two of the semiconductor dies (e.g., 210, 220, or a combination of) independently in the semiconductor wafer-form packages 200-1 and 200-2.

Figure 15:
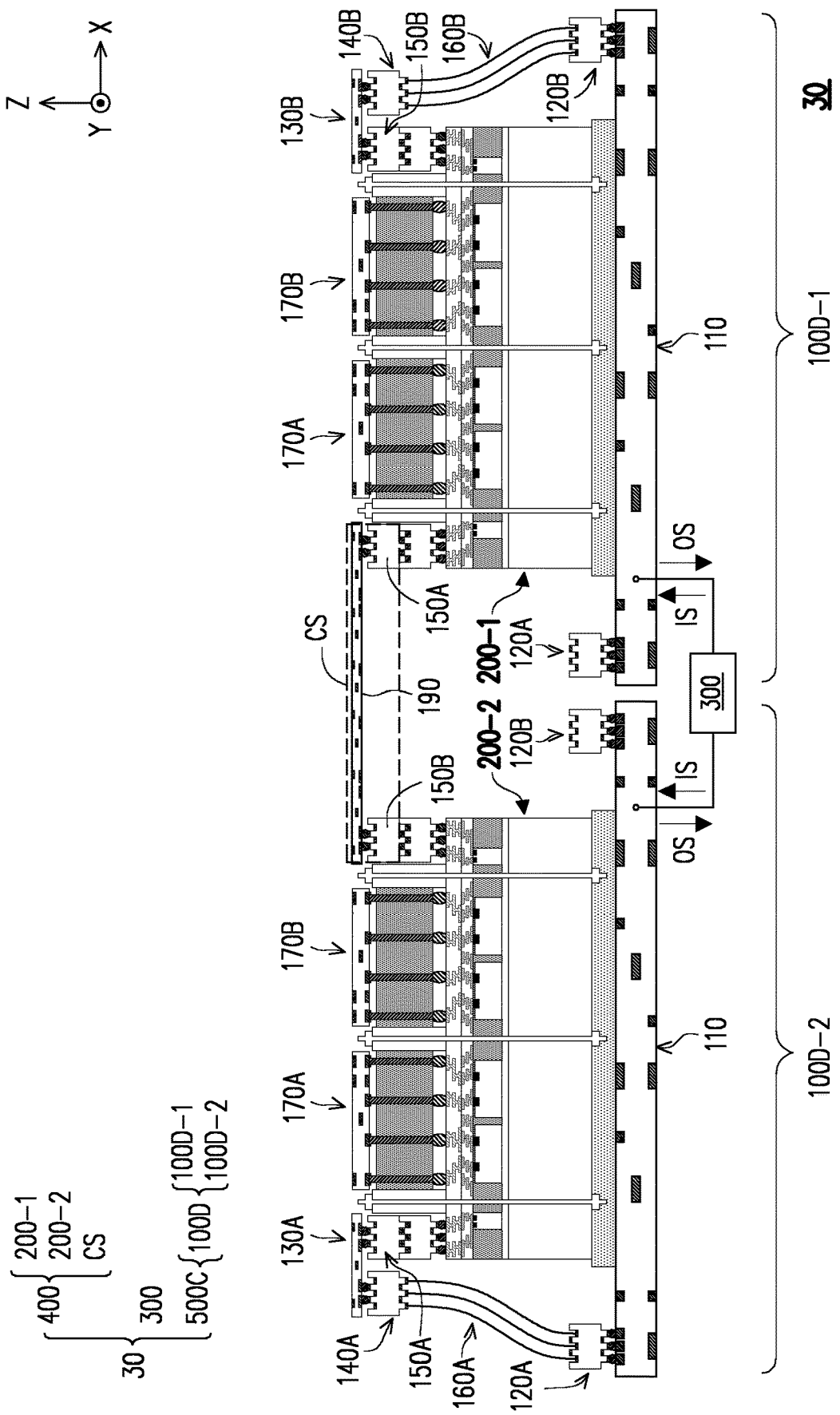
FIG. 15 is a schematic cross-sectional view of an assembly of a testing module and a semiconductor wafer-form package in accordance with some embodiments of the disclosure.

FIG. 15 is a schematic cross-sectional view of an assembly of a testing module and a semiconductor wafer-form package in accordance with some embodiments of the disclosure. The elements similar to or substantially the same as the elements described previously will use the same reference numbers, and certain details or descriptions (e.g. the materials, positioning configurations, electrical connection relationships, etc.) of the same elements would not be repeated herein. In certain embodiments, a testing system 500C (similar to the testing system 500A or 500B) is also employed for testing an electrical connection between two or more than two semiconductor wafer-form packages interconnected to each other by one or more than one connecting structure (e.g., CS), where the two or more than two semiconductor wafer-form packages (similar to the semiconductor wafer-form packages 200-1 and 200-2) and the connecting structure CS together form a semiconductor package (e.g., 400 depicted in FIG. 15). For the testing method using the testing system 500C, several possible testing electrical transmitting paths employed in the assembly 30 can be the same as or similar to the testing electrical transmitting paths P13 and P14 employed in the assembly 20. More possible testing electrical transmitting paths, which may further have similar routing paths to the testing electrical transmitting path P1-P12, may be employed in the assembly 30.

For example, as shown in FIG. 15, the testing system 500C is provided and connected to the controller 300, and the semiconductor package 400 is installed on the testing system 500C for testing, where the connecting structure 190 and the connectors 150 located over and electrically connected to the connecting structure 190 (as described in FIG. 12A and depicted in 15A) or the connecting structure 190' and the connectors 150 physically and electrically connected to the connecting structure 190' (as described in FIG. 13) are individually considered as one connecting structure CS connecting two adjacent semiconductor wafer-form packages (e.g., 200-1 and 200-2). Such circuit structure CS may serve a bridge between the two adjacent semiconductor wafer-form packages 200-1 and 200-2 for rendering an electrical communication thereof. In other words, owing the connecting structure CS included in the semiconductor package 400, the testing system 500C, which is employed for testing an electrical connection between the inter-connected, the two inter-connected semiconductor wafer-form packages 200-1 and 200-2 in the semiconductor package 400, may be free of the connecting structure 190 and the connectors 150 connected thereto.

The testing module 100B, 100C may be also employed in the assembly 10 (involving one testing module) or the assemblies 20-30 (involving two or more testing modules) with the similar testing electrical transmitting paths as discussed above for testing one or more than one semiconductor wafer-form package 200. The disclosure is not limited thereto.

In accordance with some embodiments, a testing module for a semiconductor wafer-form package includes a circuit board structure, first connectors, a first connecting structure, second connectors, third connectors and a first bridge connector. The circuit board structure includes two edge regions and a main region located therebetween. The first connectors are located over the edge regions and connected to the circuit board structure. The first connecting structure is located over and distant from the circuit board structure. The second connectors and third connectors are located over and connected to the first connecting structure, where the third connectors are configured to transmit electric signals for testing the semiconductor wafer-form package being placed over the main region. The first bridge connector is electrically coupling the circuit board structure and the first connecting structure by connecting the second connectors and the first connectors.

In accordance with some embodiments, a testing method for a semiconductor wafer-form package includes the following steps, providing a testing module comprising a circuit board structure having a main region and an edge region adjacent thereto, first connectors connected to the circuit board structure and distributed over the edge region, an first connecting structure located over and distant from the circuit board structure, second connectors and third connectors located over and connected to the first connecting structure, and a first bridge connector connecting the second connectors and the first connectors; placing the semiconductor wafer-form package on the circuit board structure over the main region, the semiconductor wafer-form package comprising a semiconductor die, a redistribution circuit structure electrically connected to the semiconductor die, and at least one socket and fourth connectors electrically connected to the semiconductor die through the redistribution circuit structure; and performing an automated test sequence on the semiconductor wafer-form package through the testing module.

In accordance with some embodiments, a testing method using at least one testing module for a semiconductor wafer-form package, wherein the semiconductor wafer-form package is removably installed to and electrically connected to the at least one testing module, and the at least one testing module comprises a circuit board structure with first connectors located thereon and electrically connected thereto, an first connecting structure with second connectors and third connectors located thereon and electrically connected thereto, a first bridge connector electrically connecting the circuit board structure and the first connecting structure, and a second bridge connector overlapped with and electrically connected to the circuit board structure through the semiconductor wafer-form package, and the testing method includes the following steps, sending, via a first electrical transmitting path comprising the circuit board structure, the first connectors, the first bridge connector, the second connectors, the first connecting structure and the third connectors comprised in the at least one testing module and fourth connectors and a redistribution circuit structure comprised in the semiconductor wafer-form package, a first testing signal to the semiconductor wafer-form package; and receiving a first responsive signal from the semiconductor wafer-form package.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A testing module for a semiconductor wafer-form package, comprising:
   a circuit board structure, comprising two edge regions and a main region disposed therebetween;
   first connectors, disposed over the edge regions and mechanically connected to the circuit board structure;
   a first connecting structure, disposed over and distant from the circuit board structure;
   second connectors and third connectors, disposed over and mechanically connected to the first connecting structure, wherein the third connectors are configured to transmit electric signals for testing the semiconductor wafer-form package being placed over the main region; and
a first bridge connector, electrically coupling the circuit board structure and the first connecting structure by contacting the second connectors and the first connectors,
wherein the semiconductor wafer-form package is surrounded by the circuit board structure, the first connectors, the first connecting structure, the second connectors, the third connectors, and the first bridge connector.

2. The testing module of claim 1, wherein the first bridge connector comprises a plurality of parallel conductive wires.

3. The testing module of claim 1, wherein the first connecting structure comprises a circuit board or a plurality of parallel conductive wires.

4. The testing module of claim 1, wherein the first bridge connector is in physical contact with the second connectors and the first connectors.

5. The testing module of claim 1, wherein the second connectors and the third connectors are standing at a same side of the first connecting structure.

6. The testing module of claim 1, wherein the second connectors and the third connectors are standing at two opposite sides of the first connecting structure along a stacking direction of the semiconductor wafer-form package and the circuit board structure.

7. The testing module of claim 1, wherein the semiconductor wafer-form package comprises fourth connectors and at least one socket sounded by the fourth connectors, and
wherein the third conductors are electrically coupled to the fourth conductors for forming a temporarily electrical connection with the semiconductor wafer-form package, and the third connectors independently are overlapped with a respective one of the fourth connectors along a stacking direction of the semiconductor wafer-form package and the testing module.

8. The testing module of claim 7, further comprising:
a second bridge connector, disposed over the main region and electrically coupled to the first connecting structure through the semiconductor wafer-form package, wherein the second bridge connector comprises a substrate with a circuitry embedded therein and a plurality of pins disposed over the substrate and electrically coupled to the circuitry.

9. The testing module of claim 8, wherein the second bridge connector is removably installed into the at least one socket of the semiconductor wafer-form package, and the pins are respectively inserted into through holes of the at least one socket for forming a further temporarily electrical connection with the semiconductor wafer-form package.

10. The testing module of claim 1, further comprising:
an elastic element, disposed over the main region, wherein the elastic element is sandwiched between the semiconductor wafer-form package and the circuit board structure.

11. A testing system, comprising:
two or more than two testing modules as claimed in claim 1,
wherein two or more than two semiconductor wafer-form packages respectively corresponding to the two or more than two testing modules are electrically coupled to each other through a third bridge connector, and the two or more than two testing modules are electrically coupled through the two or more than two semiconductor wafer-form packages, or wherein two or more than two testing modules are electrically coupled to each other through a third bridge connector.

12. The testing system of claim 11, wherein the third bridge connector comprises a printed circuit board or a plurality of parallel conductive wires.

13. A testing module for a semiconductor wafer-form package, comprising:
a circuit board structure, comprising two edge regions and a main region located therebetween;
first connectors, disposed on the edge regions and connected to the circuit board structure;
an elastic element, disposed on the main region, wherein the elastic element is sandwiched between the semiconductor wafer-form package and the circuit board structure;
a first connecting structure, disposed over and distant from the circuit board structure;
second connectors and third connectors, disposed over and connected to the first connecting structure, wherein the third connectors are configured to transmit electric signals for testing the semiconductor wafer-form package being placed over the main region; and
a first bridge connector, electrically coupling the circuit board structure and the first connecting structure by connecting the second connectors and the first connectors.

14. The testing module of claim 13, wherein:
the first bridge connector comprises a plurality of parallel conductive wires, and
the first connecting structure comprises a circuit board or a plurality of parallel conductive wires.

15. The testing module of claim 13, wherein the semiconductor wafer-form package is located in an accommodating space confined by the first connecting structure, the first bridge connector and the circuit board structure and comprises fourth connectors and at least one socket sounded by the fourth connectors, and
wherein the third conductors are electrically coupled to the fourth conductors for forming a temporarily electrical connection with the semiconductor wafer-form package, and the third connectors independently are overlapped with a respective one of the fourth connectors along a stacking direction of the semiconductor wafer-form package and the testing module.

16. The testing module of claim 15, further comprising:
a second bridge connector, located over the main region and electrically coupled to the first connecting structure through the semiconductor wafer-form package, wherein the second bridge connector comprises a substrate with a circuitry embedded therein and a plurality of pins located over the substrate and electrically coupled to the circuitry.

17. The testing module of claim 16, wherein the second bridge connector is removably installed into the at least one socket of the semiconductor wafer-form package, and the pins are respectively inserted into through holes of the at least one socket for forming a further temporarily electrical connection with the semiconductor wafer-form package.

18. A testing module for a semiconductor wafer-form package, comprising:
a circuit board structure, comprising two edge regions and a main region located therebetween;
first connectors, disposed on the edge regions and connected to the circuit board structure;

a first connecting structure and a second connecting structure, disposed over and distant from the circuit board structure;

second connectors and third connectors, disposed over and connected to the first connecting structure and the second connecting structure, wherein the third connectors are configured to transmit electric signals for testing the semiconductor wafer-form package being placed over the main region;

a first bridge connector, electrically coupling the circuit board structure to the first connecting structure and the second connecting structure by connecting the second connectors and the first connectors; and a second bridge connector, disposed over the main region and electrically coupled to the first connecting structure and the second connecting structure through the semiconductor wafer-form package, wherein the second bridge connector is configured to removably install on the semiconductor wafer-form package, wherein the semiconductor wafer-form package is surrounded by the circuit board structure, the first connectors, the first bridge connector, the second connectors, the first connecting structure, the second connecting structure, the third connectors, and the second bridge connector.

19. The testing module of claim 18, wherein a first group of the second connectors and a first group of the third connectors are disposed on and electrically coupled to the first connecting structure, and a projection of each second connector of the first group of the second connectors and a projection of each third connector of the first group of the third connectors are within a projection of the first connecting structure along a stacking direction of the first connectors and the circuit board structure, wherein a second group of the second connectors and a second group of the third connectors are disposed on and electrically coupled to the second connecting structure, and a projection of each second connector of the second group of the second connectors and a projection of each third connector of the second group of the third connectors are within a projection of the second connecting structure along the stacking direction of the first connectors and the circuit board structure.

20. The testing module of claim 18, wherein in a projection on the circuit board structure along a stacking direction of the first connectors and the circuit board structure, the second bridge connector is surrounded by the second connectors and the third connectors.

* * * * *